(12) United States Patent
Kokudo et al.

(10) Patent No.: US 6,445,602 B1
(45) Date of Patent: Sep. 3, 2002

(54) STRUCTURE AND METHOD FOR CORRECTION OF DEFECTIVE ANALOG DATA IN A NONVOLATILE SEMICONDUCTOR MEMORY

(75) Inventors: Shingo Kokudo; Youichi Nakasone; Fumitaka Okamoto, all of Ibaraki (JP)

(73) Assignee: NuCore Technology Inc., Santa Clara, CA (US)

( * ) Notice: Subject to any disclaimer, the term of this patent is extended or adjusted under 35 U.S.C. 154(b) by 0 days.

(21) Appl. No.: 09/427,838

(22) Filed: Oct. 26, 1999

(30) Foreign Application Priority Data

Oct. 28, 1998  (JP) ............................................ 10-306827

(51) Int. Cl.[7] .............................................. G11C 27/00
(52) U.S. Cl. ........................................ 365/45; 365/233
(58) Field of Search ......................... 365/45, 233, 194, 365/93, 49, 191

(56) References Cited

U.S. PATENT DOCUMENTS 5,280,358 A    1/1994  Yushiya et al. .............. 358/213

5,784,526 A  * 7/1998  Shimoda et al. ............ 386/109
6,232,947 B1 * 5/2001  Miyawaki et al. ............ 345/99

* cited by examiner

*Primary Examiner*—David Nelms
*Assistant Examiner*—Thong Le
(74) *Attorney, Agent, or Firm*—Townsend and Townsend and Crew LLP

(57) ABSTRACT

A nonvolatile semiconductor memory includes a memory unit, memory control unit, defect position detection unit, and data correction unit. The memory unit has a plurality of memory cells to discretely store an analog signal such as an image signal as analog data in the form of an analog value. The memory control unit sequentially selects the memory cells as a read out target of the memory unit in response to a predetermined clock. The defect position detection unit detects, on the basis of defect position information indicating a position of defective analog data included in the analog data read out from the memory unit, whether a memory cell corresponding to the defect position is selected by the memory control unit, and outputs a detection output. The data correction unit corrects the analog data at the defect position in accordance with the detection output from the defect position detection unit by using another analog data of the analog signal stored in said memory unit.

24 Claims, 15 Drawing Sheets

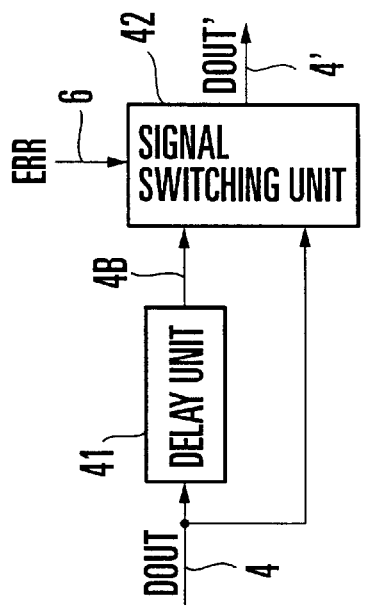
FIG.2A
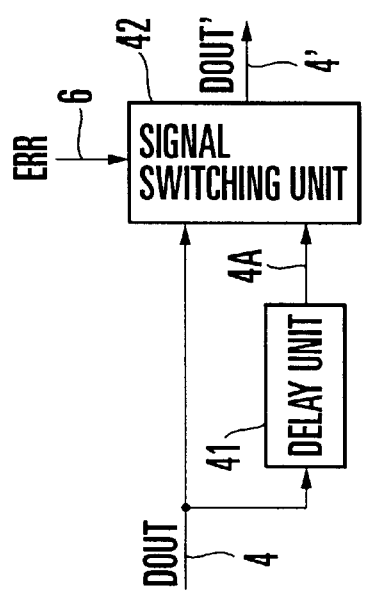
FIG.2C
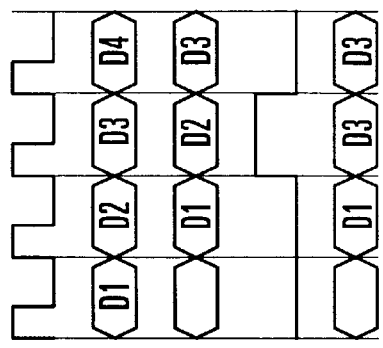
FIG.2B
FIG.2D

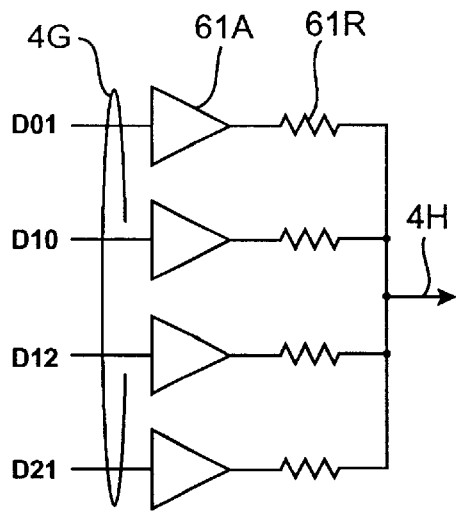
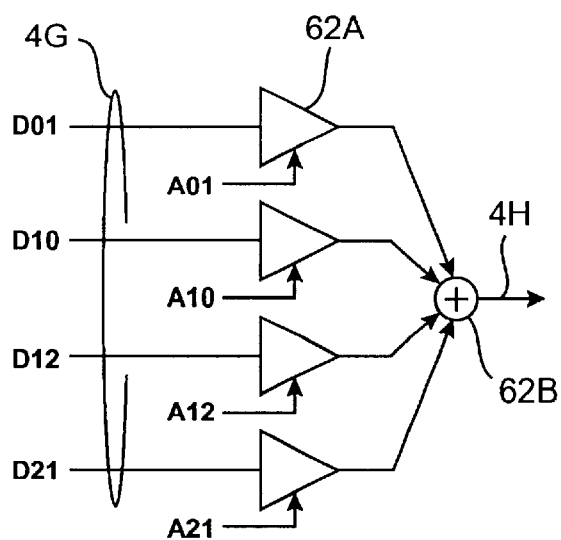
FIG. 7A
FIG. 7B
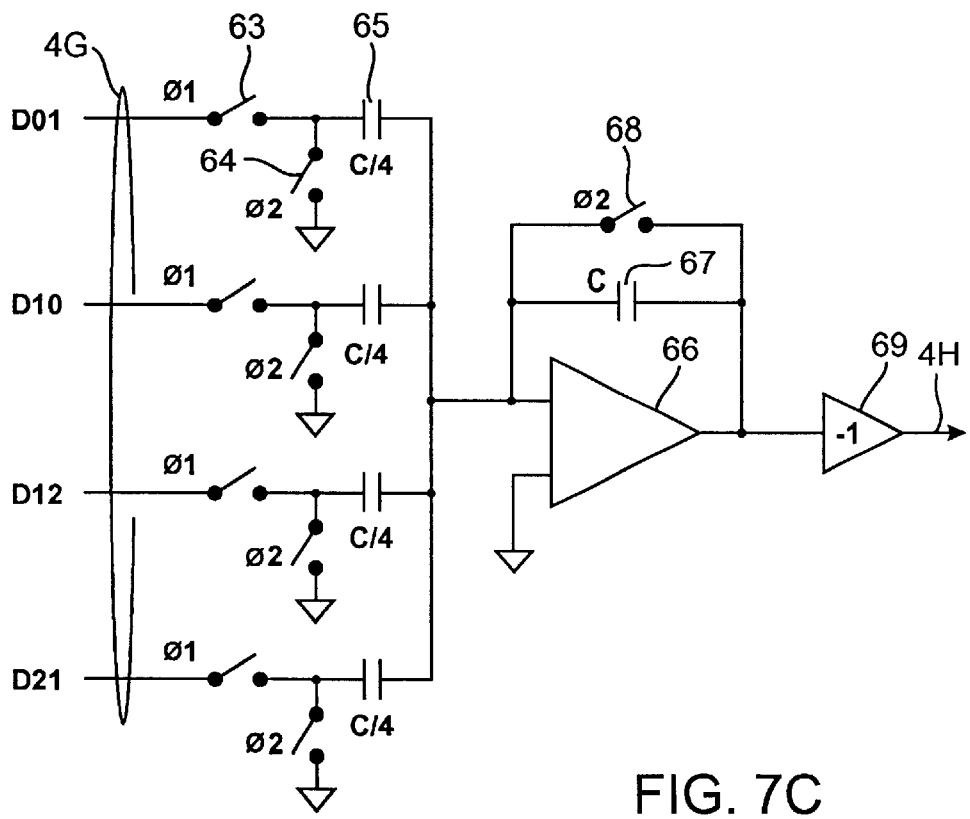
FIG. 7C

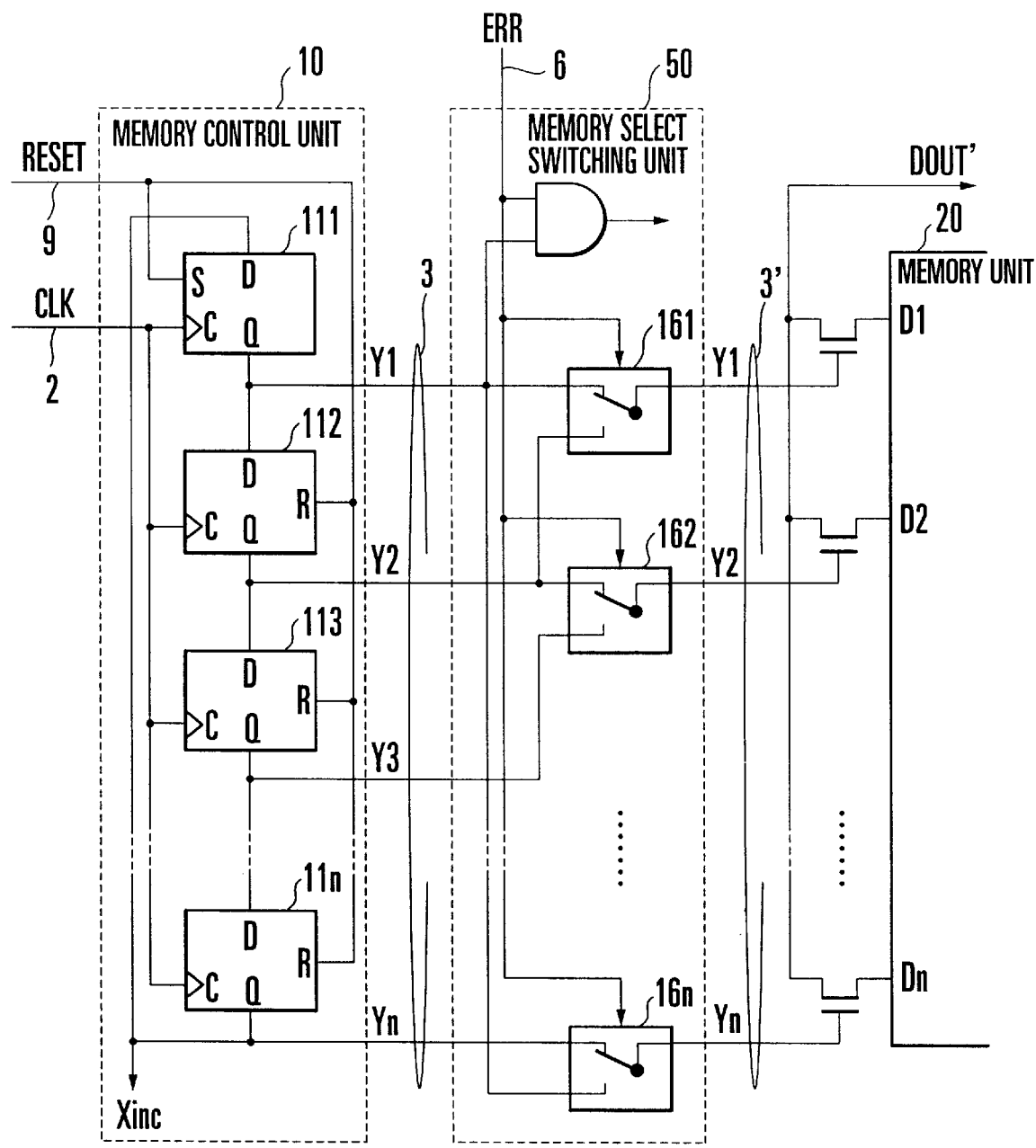
F I G. 10

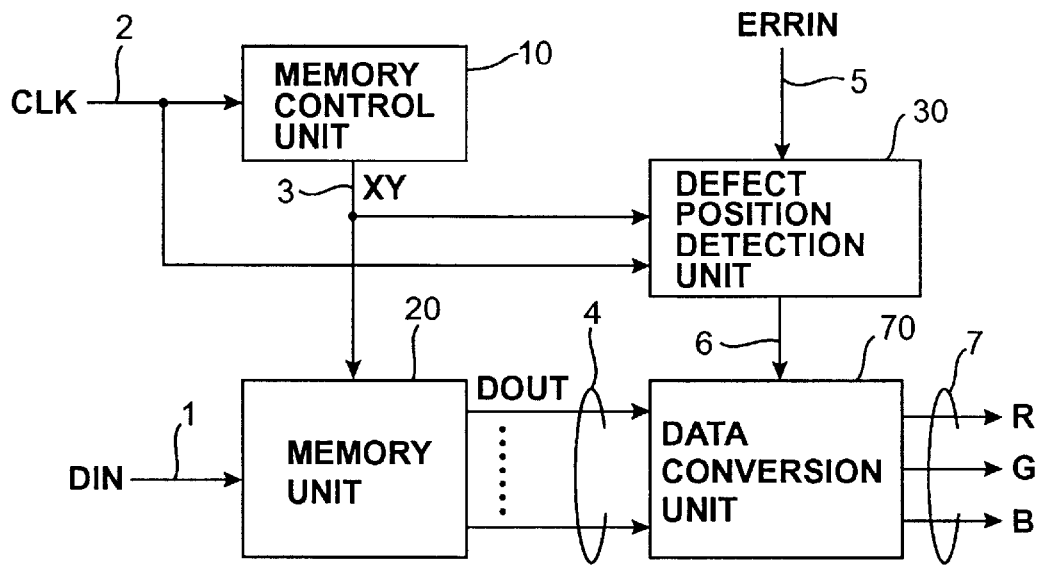
FIG. 12
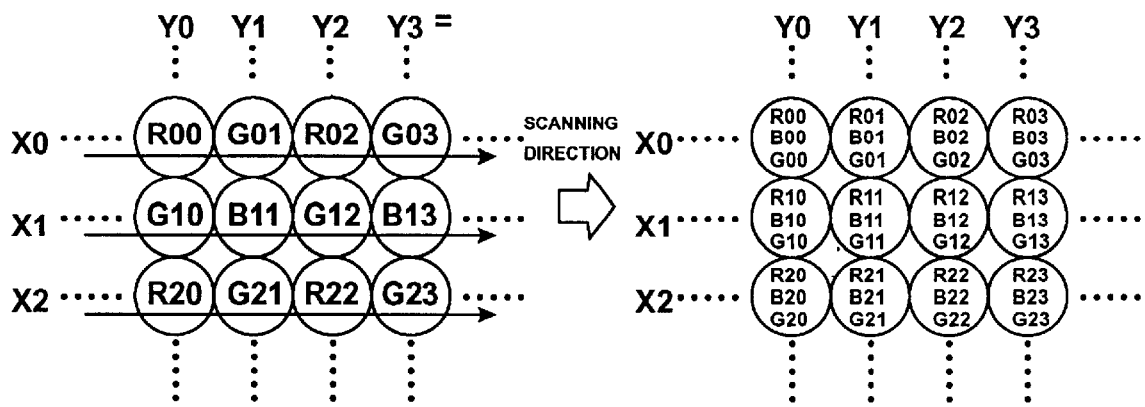
FIG. 13A
FIG. 13B
$$R11 = \frac{R01 + R10 + R12 + R21}{4}$$
$$G11 = \frac{G01 + G10 + G12 + G21}{4}$$
FIG. 13C
$$R12 = \frac{R02 + R22}{2}$$
$$B12 = \frac{B11 + B13}{2}$$
FIG. 13D

STRUCTURE AND METHOD FOR CORRECTION OF DEFECTIVE ANALOG DATA IN A NONVOLATILE SEMICONDUCTOR MEMORY

BACKGROUND OF THE INVENTION

The present invention relates to a nonvolatile semiconductor memory and, more particularly, to a nonvolatile semiconductor memory for discretely storing an analog signal such as an image signal in the form of an analog value.

In a nonvolatile semiconductor memory that discretely stores an analog signal such as an image signal in the form of an analog value, as the memory capacity increases, the number of memory cells for individually storing the analog values and the number of interconnections increase, and the pattern size on the memory chip decreases more and more.

As these factors that produce a defect in the memory chip increase, it is important to remedy the defect occurred in the manufacturing process in order to increase the productivity and to reduce the cost.

Currently, in an imaging device such as a digital still camera, an analog image signal obtained by an image sensing element such as a CCD is converted into digital data by an A/D converter, and is stored as a digital value in a nonvolatile semiconductor memory such as a flash memory.

In such a digital nonvolatile semiconductor memory, in order to remedy a memory cell defect having occurred in the manufacturing process, a redundant cell is formed on the pattern in advance, and a defective memory cell is replaced with the redundant cell when necessary.

FIG. 20 shows a redundant arrangement of a conventional semiconductor memory.

Referring to FIG. 20, redundant cells 205 replaces all memory cells belonging to a predetermined column or row of a memory cell array 204.

Defective cell addresses R0 to Rn indicating the position of a defective memory cell in accordance with the defect inspection result of a memory cell array are set in a redundant address setting unit 201.

The defective cell addresses R0 to Rn are compared with cell select addresses A0 to An by a redundant address comparator 202.

A redundancy indicating signal (ON/OFF) indicating whether this redundant arrangement is to be operated or not is set in the redundant address setting unit 201.

When the redundancy indicating signal is ON and the redundant address comparator 202 determines that the defective cell addresses R0 to Rn and the cell select addresses A0 to An coincide with each other, an output from a NAND gate 206 changes to LOW level to turn off all gates 207.

In contrast to this, an output from an AND gate 208 changes to HIGH level to turn on a gate 209.

Accordingly, supply of all column select signals 210 decoded by an address decoder 203 is stopped in response to the OFF state of the gates 207, and a column select signal 211 is supplied to the redundant cell 205 in response to the ON state of the gate 209. The redundant cell 205 is selected in place of a predetermined column of the memory cell array 204 to write/read out data.

FIGS. 21A and 21B show arrangements of the redundant address setting unit 201. In a laser fuse scheme redundant address setting unit, as shown in FIG. 21A, during the chip manufacture, the fuse is disconnected by a laser beam in accordance with the inspection result of the memory cell array 204, to set the defective cell addresses R0 to Rn and to turn on/off the redundancy indication signal. In a flash memory scheme redundant address setting unit, as shown in FIG. 21B, a redundant address is stored in the nonvolatile memory cell.

In these conventional semiconductor memories, however, a redundant arrangement which becomes unnecessary when no memory cell has a defect, i.e., a redundant cell and a control circuit portion for it, must be formed on the chip in advance. Hence, the chip area cannot accordingly be utilized effectively.

In particular, in an analog nonvolatile semiconductor memory which stores an analog signal in the form of an analog value, the presence of a redundant arrangement is a more serious issue partly because the peripheral circuit concerning write/read out operation is larger than in a digital memory.

In the conventional redundant arrangement, for example, for a memory block size of 512 columns×4,096 rows (2 Mbits), redundant cells for only 2 columns×1 row are provided. In this case, in spite that the number of all redundant cells is 512×2+4,096=5,120, concerning a defective cell at a random position which occurs very often as a defect mode, only 3 defective cells can be reliably remedied, and such defective cells cannot be efficiently coped with.

A large number of redundant cells may be provided so that they can replace more columns or rows. In this case, however, the chip area occupied by the redundant arrangement increases greatly.

With this redundant arrangement, although an error in digital information can be corrected by using a check sum or the like, an error in analog information cannot be corrected easily. Since one memory cell stores analog information corresponding to a large number of bits, analog information stored in one memory cell is much more important than digital information stored in one memory cell. Therefore, a defective cell must be remedied reliably.

SUMMARY OF THE INVENTION

According to the present invention, there is provided a nonvolatile semiconductor memory comprising a memory unit having a plurality of memory cells to discretely store an analog signal, such as an image signal, as analog data in the form of an analog value, a memory control unit for sequentially selecting the memory cells as a read out target of the memory unit in response to a predetermined clock, a defect position detection unit for detecting, on the basis of defect position information indicating a position of defective analog data included in the analog data read out from the memory unit, whether a memory cell corresponding to the defect position is selected by the memory control unit, and outputting a detection output, and a data correction unit for correcting the analog data at the defect position in accordance with the detection output from the defect position detection unit by using another analog data of the analog signal stored in said memory unit.

BRIEF DESCRIPTION OF THE DRAWINGS

FIGS. 2A to 2D are views for explaining arrangements of a data correction unit;

FIGS. 7A to 7C are circuit diagrams showing arrangements of an interpolating arithmetic unit;

FIG. 10 is a circuit diagram showing an arrangement of the Y-address side of the memory select switching unit;

FIG. 12 is a block diagram showing a nonvolatile semiconductor memory according to the fourth embodiment;

FIGS. 13A to 13D are views for explaining the relationship between a color interleave image signal and RGB image data;

DESCRIPTION OF THE PREFERRED EMBODIMENTS

The present invention will be described with reference to the accompanying drawings.

Figure 1:
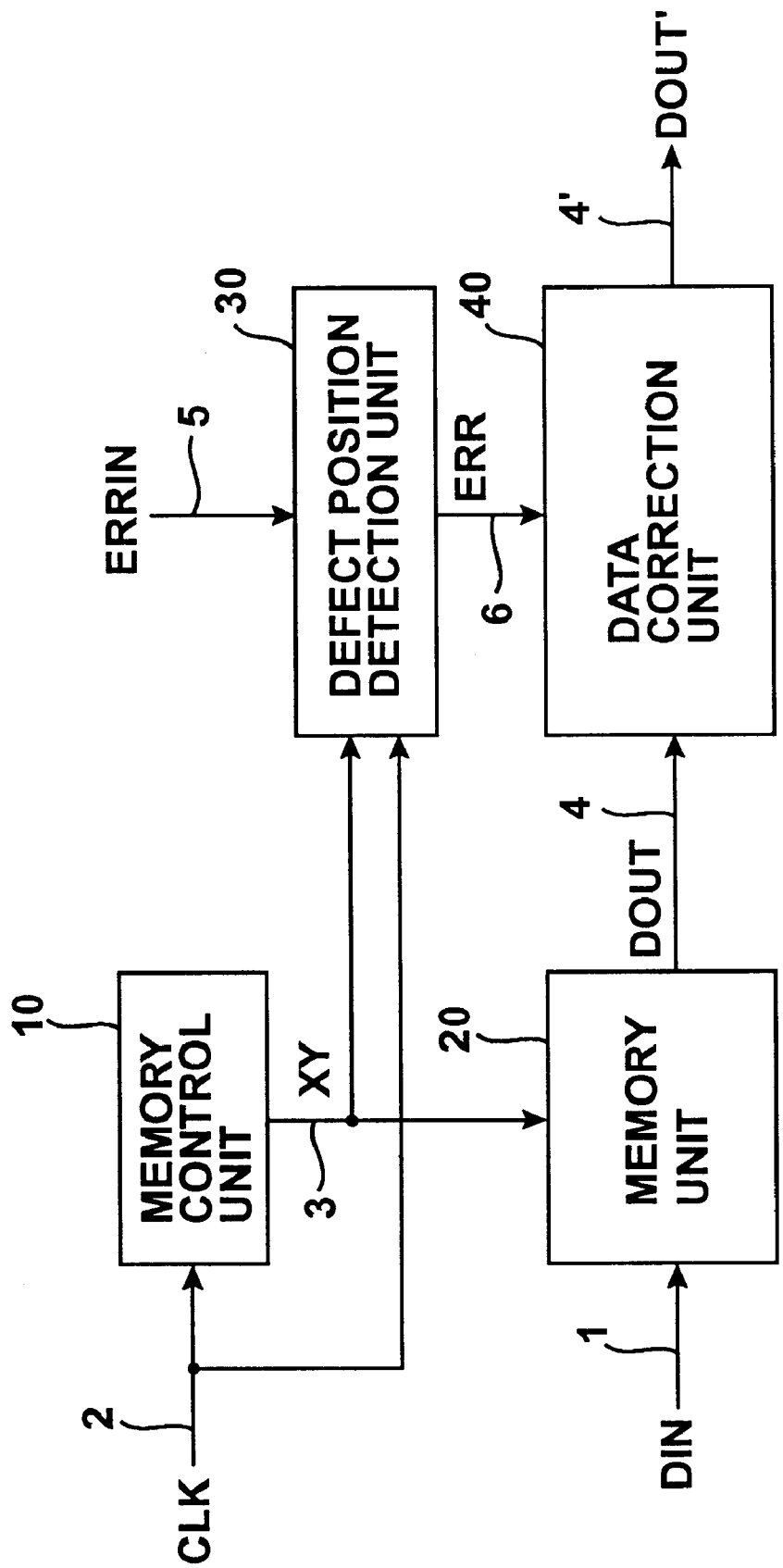
FIG. 1 is a block diagram of a nonvolatile semiconductor memory according to the first embodiment.

FIG. 1 shows a nonvolatile semiconductor memory according to the first embodiment of the present invention. Referring to FIG. 1, a memory unit 20 has a large number of memory cells storing analog data. The memory unit 20 stores an analog signal (DIN) 1 such as an input image signal in the form of an analog value discretely with its individual memory cells.

Note that the analog signal 1 has a large number of analog amplitude values (or multilevel digital amplitude values) continuously arranged in a predetermined order on the time base.

In read out operation, a memory control unit 10 outputs addresses (X and Y addresses) 3 in response to a predetermined clock (CLK) 2 to sequentially select predetermined memory cells in the memory unit 20.

Defect position information (ERRIN) 5 indicates a defect position on readout data (DOUT) 4 read out from the memory unit 20 in the form of an analog value. For example, the position information of a defective memory cell detected in the manufacturing process is used as the defect position information.

A defect position detection unit 30 compares the defect position information 5 with the address 3 sent from the memory control unit 10. When the defect position detection unit 30 detects that a memory cell corresponding to the defect position information 5 is selected and that defective data is read out, it outputs a defect detection signal (ERR) 6.

A data correction unit 40 corrects the defective data, indicated by the defect detection signal 6 and included in the readout data 4, by using another correction data at a predetermined position corresponding to the defect position of this defective data, and outputs an output data (DOUT') 4'.

In this case, the correction data is set in advance by the arrangement of the analog signal 1 input to the memory unit 20.

For example, when the defective data on the readout data 4 and analog data read out before or after it by predetermined data are closely related to each other, the defective data may be replaced with the analog data read out before or after it by the predetermined data.

FIGS. 2A to 2D show arrangements of the data correction unit 40.

Of FIGS. 2A to 2D, FIG. 2A shows a case wherein the defective data is replaced with analog data read out immediately before it, and FIG. 2B shows the operation of FIG. 2A.

FIG. 2C shows a case wherein the defective data is replaced with analog data read out immediately after it, and FIG. 2D shows the operation of FIG. 2C.

In FIG. 2A, a delay unit 41 generates, as the correction data, delay data 4A by delaying the readout data 4 by one data (one clock). Usually, the readout data 4 is selectively output from a signal switching unit 42 as output data 4'.

When the defect detection signal 6 is output, it is determined that the readout data 4 is defective data. As shown in FIG. 2B, correction data read out before the readout data 4 by one data, i.e., the delay data 4A, is selectively output.

In FIG. 2C, a delay unit 41 generates delay data 4B by delaying the readout data 4 by one data (one clock). Usually, the delay data 4B is selectively output from a signal switching unit 42 as output data 4'.

When the defect detection signal 6 is output, it is determined that the delay data 4B is defective data. As shown in FIG. 2D, correction data read out after the delay data 4B by one data, i.e., the readout data 4, is selectively output.

In FIGS. 2C and 2D, the delay data 4B selected as the output data 4' is always delayed by one data as compared to the readout data 4.

Accordingly, the defect detection signal 6 must also be delayed by one data to synchronize the defective data on the delay data 4B with the defect detection signal 6.

In this manner, the defect position detection unit 30 and data correction unit 40 are provided, and the defective data included in the readout data 4 read out from the memory unit 20 is corrected by using another correction data at the predetermined position corresponding to the defect position of this defective data, and is output as the output data 4'. Even when a defective cell occurs at a random position, it can be remedied reliably and efficiently.

A complicated redundant cell having a comparatively large circuit scale, and a control circuit portion for it need not be formed on the memory chip in advance. The chip area can be utilized effectively, and an increase in memory capacity and downsizing of the memory chip can be realized.

The delay unit 41 for delaying the readout data 4 by predetermined data, and the signal switching unit 42 are arranged in the data correction unit, and the defective data is replaced with analog data read out before or after the readout data 4 by the predetermined data. Hence, the defective data can be corrected by a very simple circuit arrangement.

Figure 3:
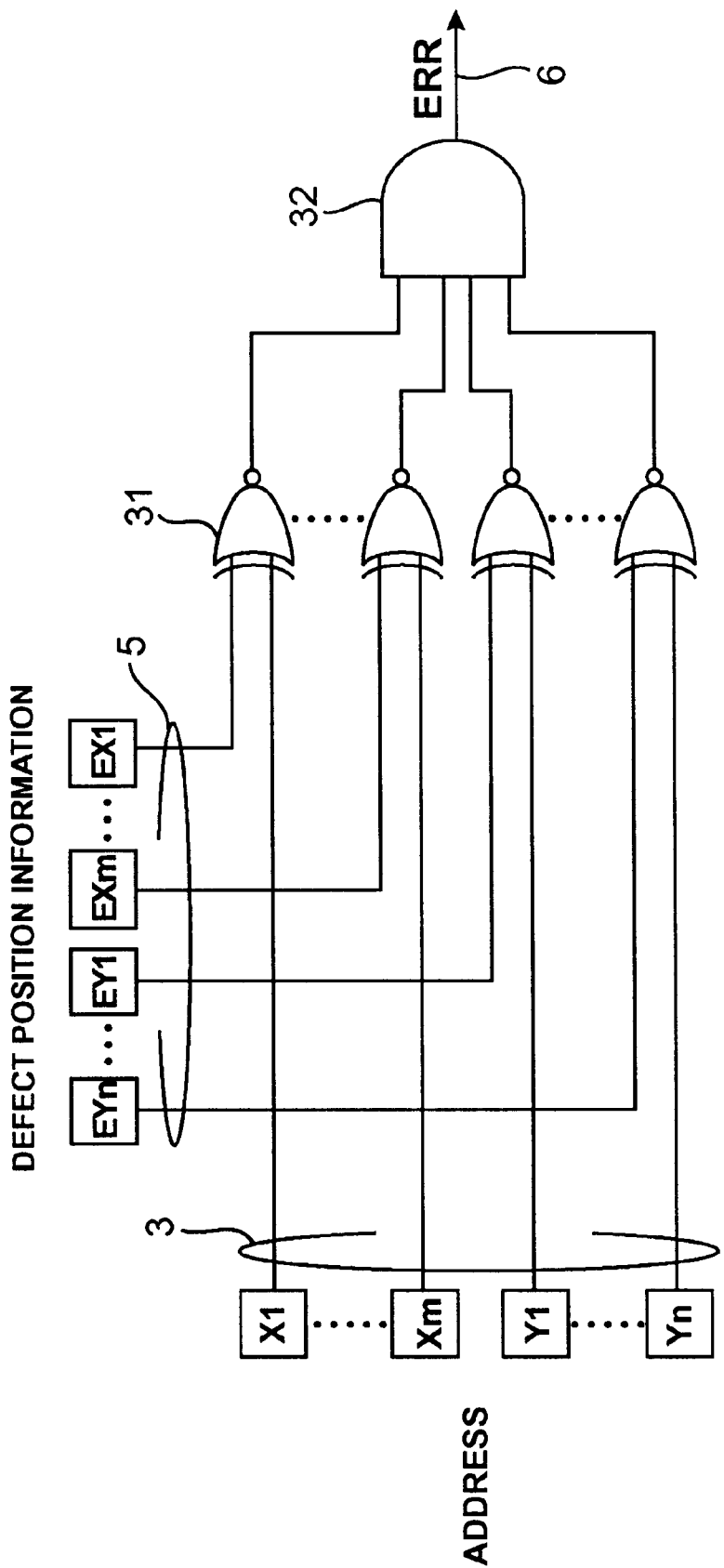
FIG. 3 is a circuit diagram showing an arrangement of a defect position detection unit.

As the defect position detection unit 30, an arrangement as shown in FIG. 3 may be used.

FIG. 3 shows an arrangement of the defect position detection unit.

In this defect position detection unit, the address 3 output from the memory control unit 10 to the memory unit 20, i.e., X1 to Xm and Y1 to Yn, and the defect position information 5, i.e., EX1 to EXm and EY1 to EYn are compared with each other by EX-NOR (exclusive NOR) gates 31, respectively.

Only when all the outputs from the memory control unit 10 coincide with the corresponding defect position information 5, an output from an AND gate 32 becomes effective and is output as the defect detection signal 6.

In this case, information indicating the X and Y addresses, i.e., the column position and row position, of each memory cell in the memory unit 20 is used as the defect position information 5.

The defect position information 5 is not limited to this, but can be position information of another format, e.g., information indicating the address of an arbitrary address space. In this case, a circuit portion for converting this information into the defect position information 5 is arranged.

A circuit portion for converting the address 3 from the memory control unit 10 into information having the same format as that of the defect position information 5, e.g., information indicating the address of an arbitrary address space, may be arranged.

The data correction unit 40 may generate correction data by using a plurality of analog data read out before and after the defective data.

Figure 4A:
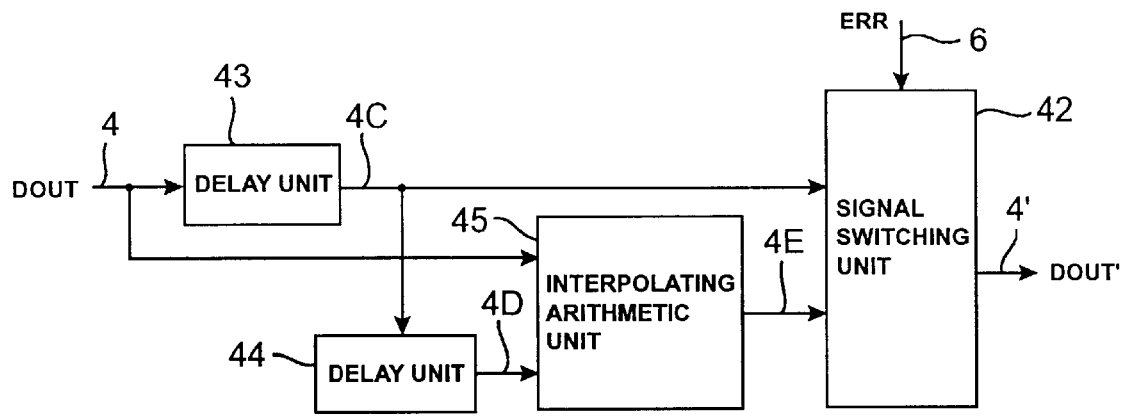
FIGS. 4A and 4B are views for explaining another arrangement of the data correction unit.
Figure 4B:
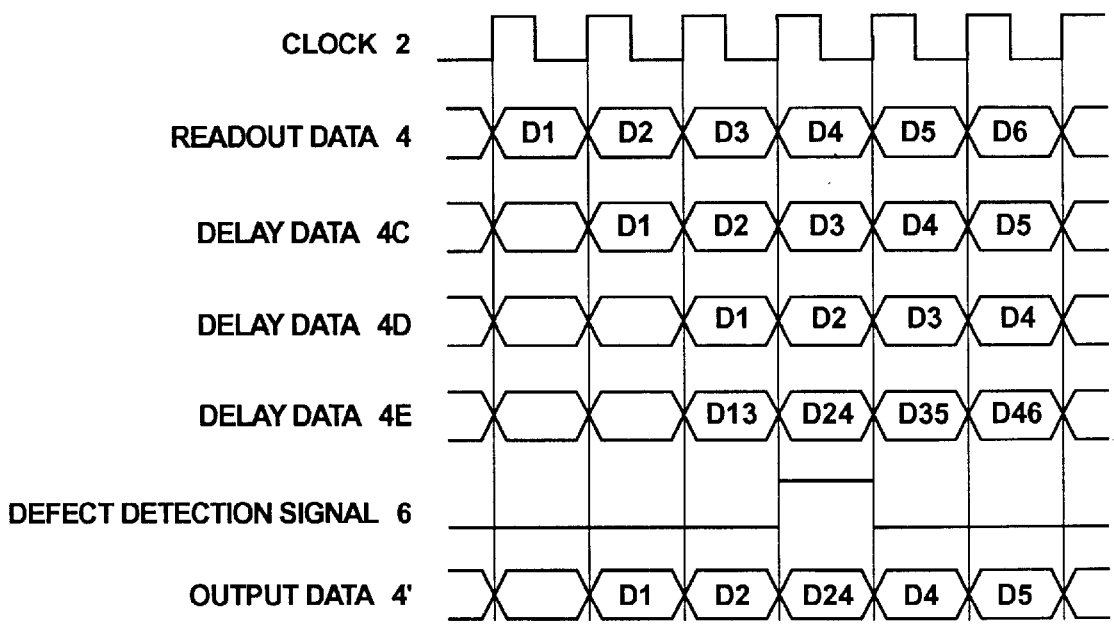

FIGS. 4A and 4B explain another arrangement of the data correction unit.

In FIG. 4A, delay units 43 and 44 are provided. The delay unit 43 generates delay data 4C by delaying the readout data 4 by one data. The delay unit 44 generates delay data 4D by delaying the delay data 4C by another data.

An interpolating arithmetic unit 45 is also arranged in FIG. 4A. The interpolating arithmetic unit 45 interpolates the delay data 4D and data 4 to generate correction data 4E.

Usually, the signal switching unit 42 selectively outputs the delay data 4C as the output data 4'.

When the defect detection signal 6 is output, it is determined that the delay data 4C is defective data. The correction data 4E from the interpolating arithmetic unit 45 is selectively output, as shown in FIG. 4B.

Hence, the defective data is replaced with the correction data 4E generated from the delay data 4D read out before the defective data by one data and the readout data 4 read out after the defective data by one data.

Therefore, when compared with the arrangement of the data correction unit described with reference to FIGS. 2A to 2D, the defective data can be corrected with the correction data having a smaller number of errors.

In the case of FIGS. 4A and 4B, the delay data 4C always selected as the output data 4' is delayed from the readout data 4 by one data.

Accordingly, the defect detection signal 6 must also be delayed by one data to synchronize the defective data on the delay data 4C with the defect detection signal 6.

The second embodiment of the present invention will be described with reference to FIG. 5.

Figure 5:
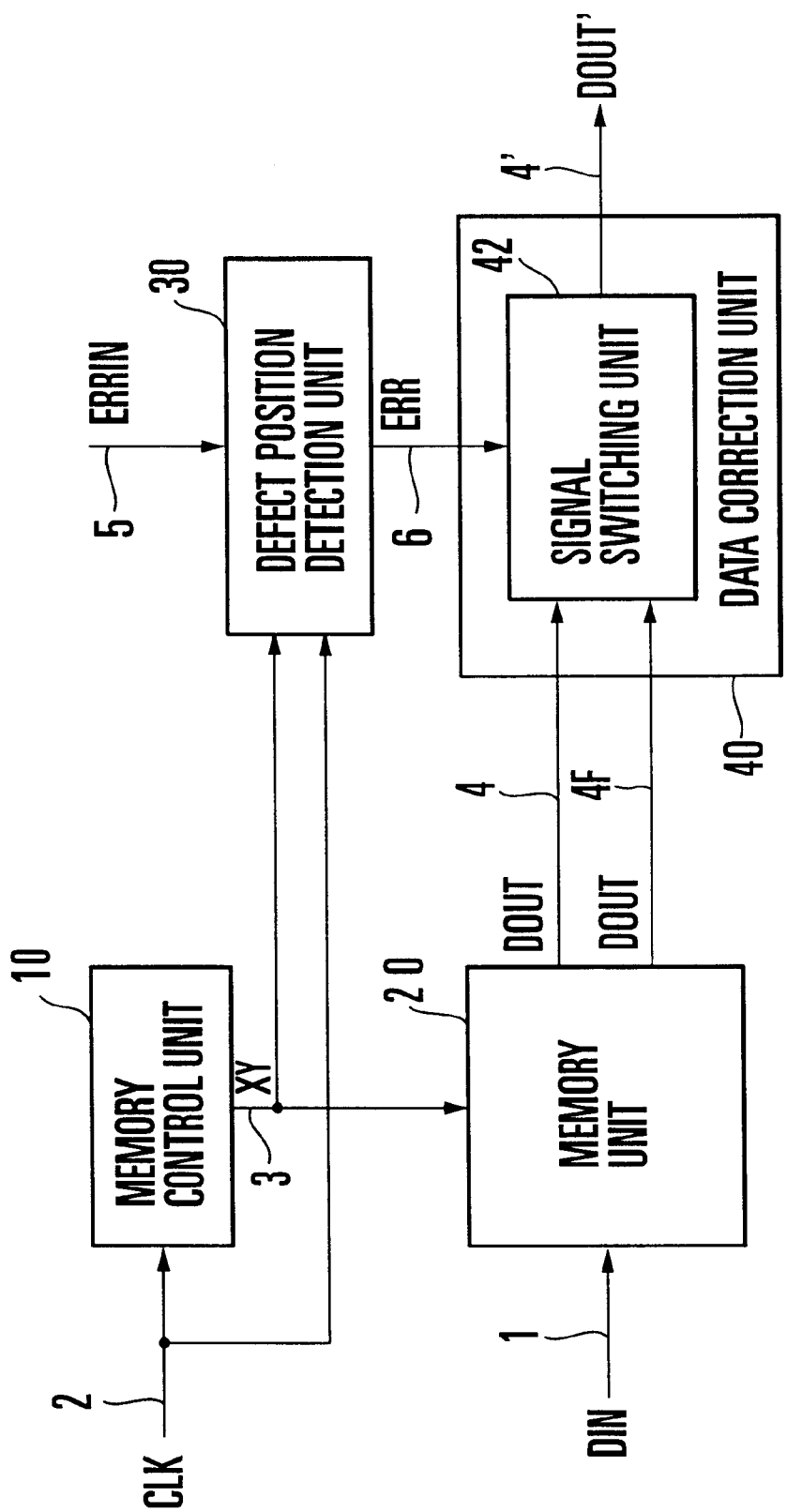
FIG. 5 is a block diagram of a nonvolatile semiconductor memory according to the second embodiment.

FIG. 5 shows a nonvolatile semiconductor memory according to the second embodiment of the present invention.

In the first embodiment described above, the readout data 4 are read out from the memory unit 20 one by one, and after that, the correction data is generated. In the second embodiment, correction data is generated from another correction data 4F read out parallel with readout data 4, and is selectively output in place of defective data.

In this case, a data correction unit 40 is comprised of a signal switching unit 42. Usually, the readout data 4 is selectively output as output data 4'. In response to a defect detection signal 6, the readout data, i.e., the correction data 4F, is selectively output in place of the defective data on the readout data 4.

A memory unit 20 for outputting the readout data 4 and correction data 4F parallel with each other may employ various types of arrangements.

For example, the arrangement of the data correction unit shown in FIG. 2A or 2C, or FIG. 4A described above may be formed in the memory unit 20.

Alternatively, the memory unit 20 may be comprised of a plurality of memory blocks. Of an input analog signal 1, the respective readout data 4 and corresponding correction data 4F may be stored in different memory blocks.

Then, when arbitrary readout data 4 is selected by an address 3 from a memory control unit 10, this readout data 4 can be read out from the memory block that stores it, and corresponding correction data 4F can be read out from another memory block.

In this manner, since the data read out from the memory unit 20 in the parallel manner are used as the correction data, even when the read out time positions of the readout data 4 and that of the correction data 4F for the readout data 4 are away from each other, the correction data 4F need not be delayed and held for a long period of time in the next stage of the memory unit 20, and degradation in the correction data 4F can be avoided.

Figure 6A:
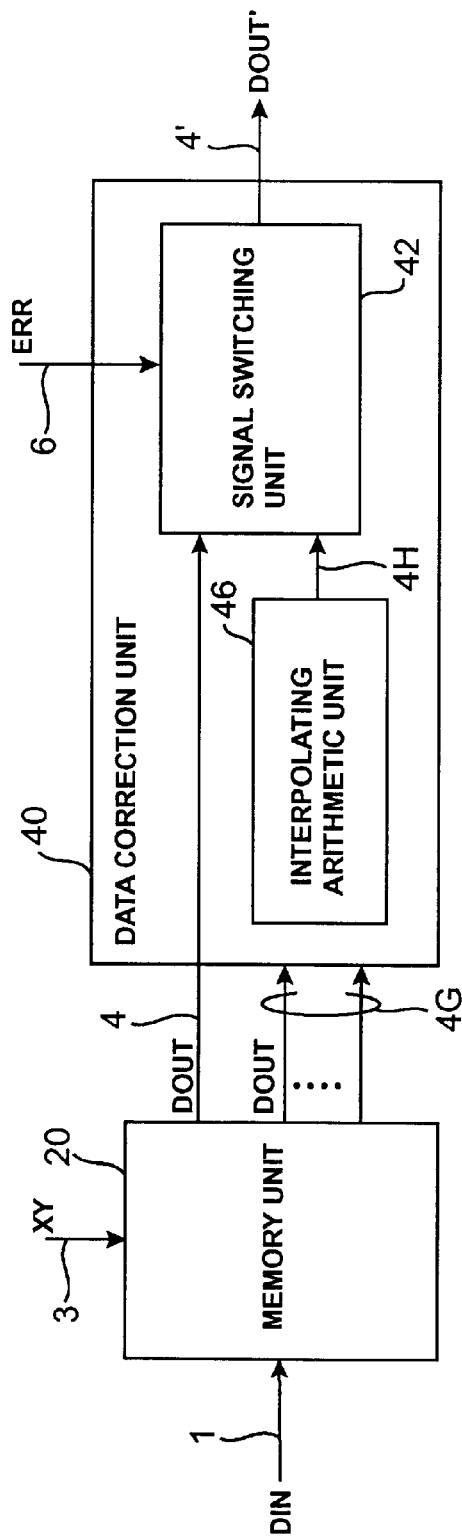
FIGS. 6A and 6B are views for explaining another nonvolatile semiconductor memory according to the second embodiment.

Alternatively, as shown in FIG. 6A, a plurality of readout data 4G may be read out parallel with readout data 4, and correction data 4H may be generated from the readout data 4G.

Figure 6B:
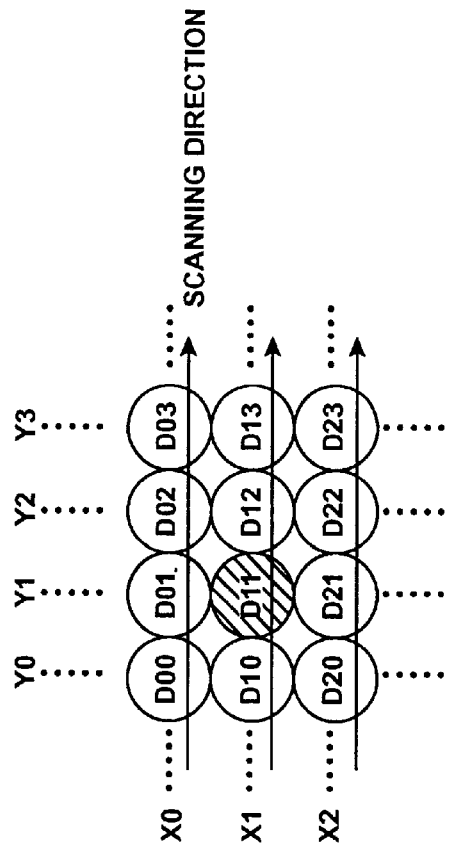

FIGS. 6A and 6B explain another nonvolatile semiconductor memory according to the second embodiment, in which FIG. 6A shows its arrangement, and FIG. 6B shows a readout data arrangement.

As shown in FIG. 6B, assume that analog data D00 to D23 are respectively stored in memory cells selected by addresses X0 to X2 and addresses Y0 and Y3 of a memory unit 20, and are read out in the order of D00 to D03, D10 to D13, and D20 to D23 (in the scanning direction indicated by arrows in FIG. 6B).

Assume that a defect occurs at the position D11. When the average of four analog data located above and below D11 and on the right and left of D11, i.e., D01, D10, D12, and D21, is to be used as the correction data for D11, these four data are read out parallel with D11 to generate the correction data.

In FIG. 6A, a data correction unit 40 includes an interpolating arithmetic unit 46. The interpolating arithmetic unit 46 interpolates a plurality of readout data 4G parallel with the readout data 4 to generate the correction data 4H.

Usually, the readout data 4 is selectively output from a signal switching unit 42 as output data 4'. In accordance with a defect detection signal 6, the correction data 4H is selectively output in place of the defective data on the readout data 4.

The memory unit 20 that outputs the readout data 4 and a plurality of other readout data 4G in parallel manner can employ various types of arrangements.

For example, the memory unit 20 may be constituted by a plurality of memory blocks. Of the input analog signal 1, the respective readout data 4 may be stored in different memory blocks in units of X addresses.

In the case of FIG. 6B, when D11 is selected by an address 3 from a memory control unit 10, D01 and D21 can be read out parallel with each other from memory cells having X addresses before and after D11 and the same Y address in memory blocks.

When the two delay units are used, as shown in FIGS. 4A and 4B described above, D10 and D12 can be read out parallel with each other from memory cells, in the same memory block as D11, having Y addresses before and after D11.

In this case, D01 and D21 must also be delayed in accordance with the delay of D11.

These delay operations may be performed by the interpolating arithmetic unit 46.

In this manner, since the correction data 4H is generated from the plurality of readout data 4G read out parallel with the readout data 4, even when a defective cell occurs at a random position, it can be remedied precisely and efficiently in the same manner as the first embodiment.

A complicated redundant cell having a comparatively large circuit scale, and a control circuit portion for it need not be formed on the memory chip in advance. The chip area can be utilized effectively, and an increase in memory capacity and downsizing of the memory chip can be realized.

When compared to FIG. 5, the correction data can be generated from a plurality of readout data, so that the defective data can be corrected with the correction data having a smaller number of errors.

The interpolating arithmetic unit 46 may use an arrangement as shown in FIGS. 7A, 7B, and 7C.

FIGS. 7A to 7C show arrangements of the interpolating arithmetic unit.

In FIG. 7A, the interpolating arithmetic unit is comprised of a product sum arithmetic circuit. Four amplifiers 61A having the equal gain (e.g., ¼) are respectively arranged in units of data D01, D10, D12, and D21 shown in FIG. 6B. Outputs from the amplifiers 61A are connected through respective resistors 61R to generate correction data 4H.

In FIG. 7B, four variable gain amplifiers 62A having variable gains (A01, A10, A12, and A21) are arranged in units of data D01, D10, D12, and D21. Outputs from the variable gain amplifiers 62A are added by an adder 62B to generate correction data 4H.

Therefore, when the respective gains A01, A10, A12, and A21 are multiplied by ¼, the average of D01, D10, D12, and D21 can be obtained in the same manner as described above.

In FIG. 7C, the average of respective data D01, D10, D12, and D21 is generated in accordance with the switched capacitor scheme.

In FIG. 7C, an inverting amplifier (operational amplifier) 66 having a capacitive element 67 with a predetermined capacitance C is provided as a feedback circuit. The respective data D01, D10, D12, and D21 are input to the inverting input terminal of the inverting amplifier 66 through capacitive elements 65 each having a capacitance ¼ the capacitance C.

Both $\phi1$ and $\phi2$ are switching signals synchronized with a clock signal 2. $\phi1$ is the inverted logic of $\phi2$.

The input terminal of each capacitive element 65 is connected to switches 63 and 64. Each switch 63 enables/disables corresponding input data. Each switch 64 connects the input terminal of the corresponding capacitive element 65 to the middle point potential of the inverting amplifier 66. The capacitive element 67 is discharged by a switch 68.

In this case, when the switches 63 are turned on in response to $\phi1$, charges corresponding to the voltages (luminances) of the respective data D01, D10, D12, and D21 are stored in the corresponding capacitive elements 65 and move to the capacitive element 67.

Since the capacitance C of the capacitive element 67 is four times the capacitance C/4 of each capacitive element 65, the voltage across the capacitive element 67 exhibits the average of the four data, and this voltage is output from the inverting amplifier 66 as the correction data.

The switches 63 are turned off in response to $\phi1$ and the switches 64 and 68 are turned on in response to $\phi2$ to discharge the capacitive elements 65 and 67, so that the capacitive elements 65 and 67 are initialized for the next data.

The output from the inverting amplifier 66 is the inverted average of the respective data D01, D10, D12, and D21. Therefore, correction data 4H can be obtained by using an inverting buffer (gain=1) 69 or the like.

When this switched capacitor scheme is employed, the number of amplifiers as analog circuits can be small, and the area occupied by the analog circuits on the memory chip can be reduced.

The third embodiment of the present invention will be described with reference to FIG. 8.

Figure 8:
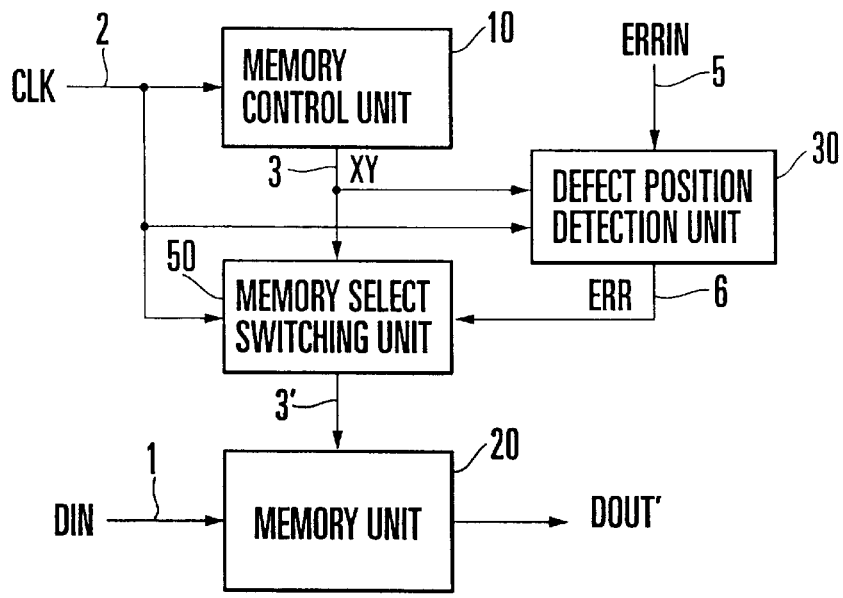
FIG. 8 is a block diagram showing a nonvolatile semiconductor memory according to the third embodiment.

FIG. 8 shows a nonvolatile semiconductor memory according to the third embodiment of the present invention.

In the first and second embodiments described above, the data correction unit 40 is connected to the output of the memory unit 20 and correction data is selectively output in place of defective data in accordance with the defect detection signal 6. In the third embodiment, in accordance with a defect detection signal 6, correction data is directly read out from a memory unit 20 in place of the defective data.

In FIG. 8, a memory select switching unit 50 is arranged between a memory control unit 10 and the memory unit 20.

Usually, an address 3 from the memory control unit 10 is selectively output from the memory select switching unit 50 to the memory unit 20 as an address 3'. In accordance with the defect detection signal 6, the address 3' indicating another memory cell that stores correction data corresponding to the defective data is selectively output.

Figure 9:
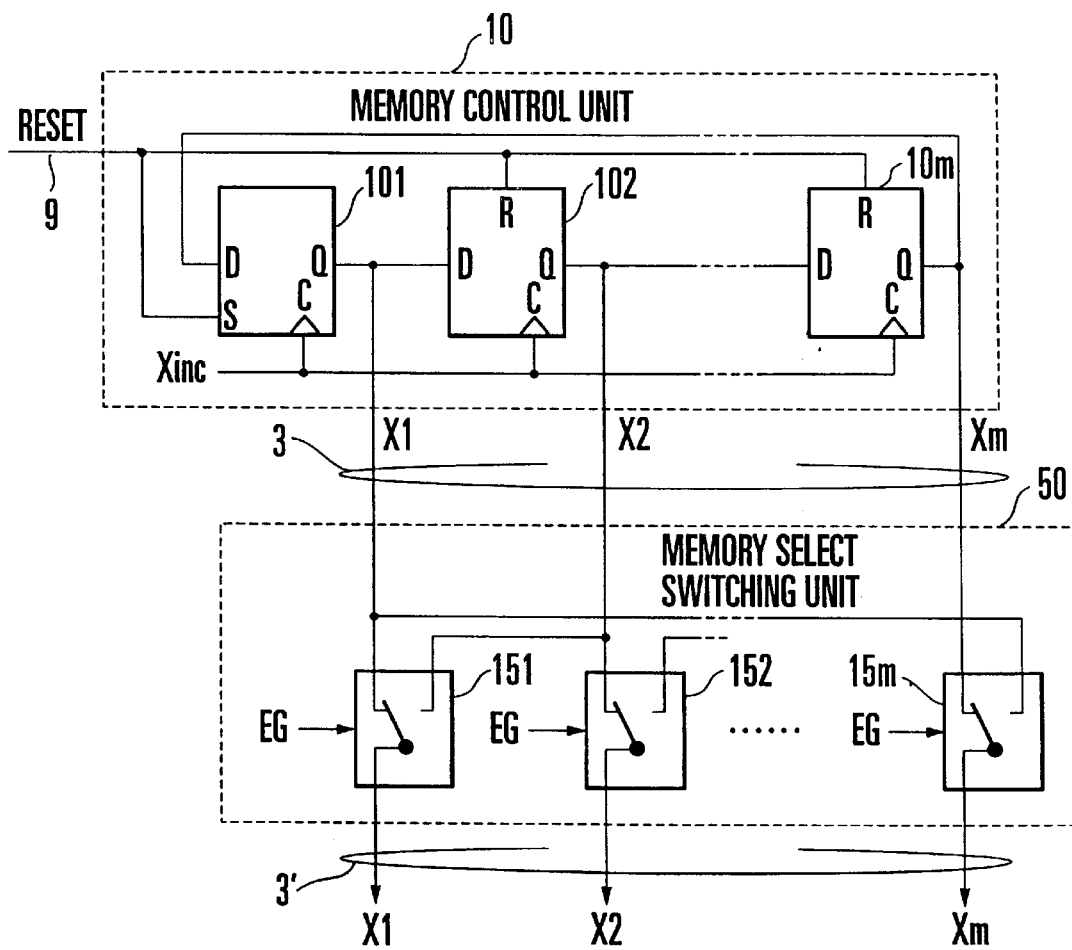
FIG. 9 is a circuit diagram showing an arrangement of the X-address side of a memory select switching unit.
Figure 11:
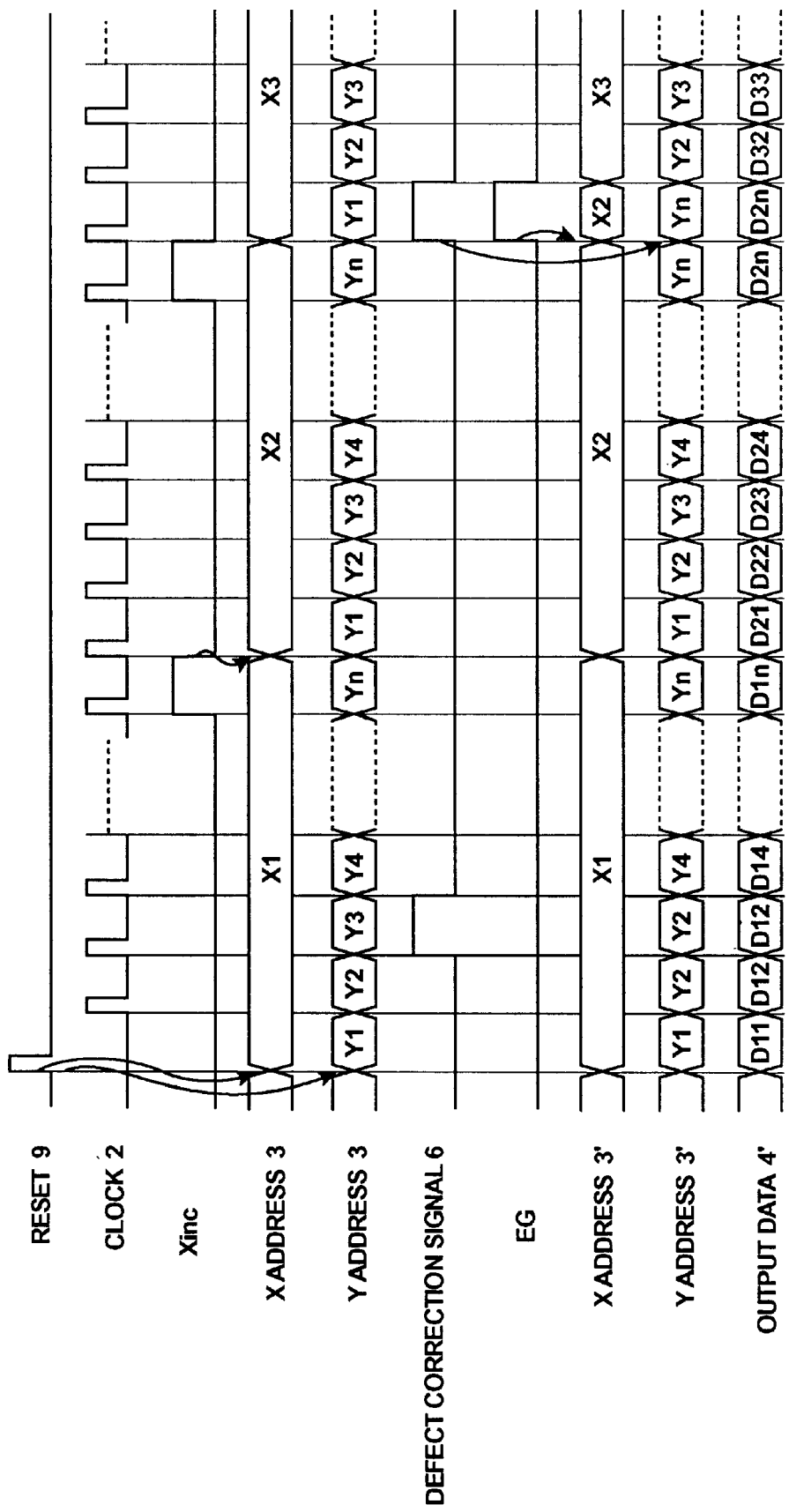
FIG. 11 is a timing chart showing read out operation.

FIG. 9 shows an arrangement of the X-address side of the memory select switching unit 50, FIG. 10 shows an arrangement of the Y-address side of the memory select switching unit 50, and FIG. 11 shows read out operation.

In the memory control unit 10 of FIG. 10, latches 111 to 11n are cascade-connected to each other. A reset signal (RESET) 9 initializes an output Q, i.e., the address (Y1 to Yn) 3, from the latches 111 to 11n, so that only Y1 become effective. Addresses Y2 to Yn become sequentially effective in response to the subsequent clocks 2.

In this case, switches 161 to 16n are arranged in the memory select switching unit 50 in units of the addresses Y1 to Yn. Usually, the switches 161 to 16n directly, selectively output the address 3 as the address 3' to the memory unit 20. In accordance with the defect detection signal 6, addresses Y2 to Yn, and Y1 are selectively output as Y1 to Yn of the address 3'.

When selecting the defective data, data shifted backward from the address 3 by one Y address is output to the memory unit 20 as the address 3'.

In the memory control unit 10 of FIG. 9, latches 101 to 10m are cascade-connected to each other. The reset signal 9 initializes an output Q, i.e., the address (X1 to Xm) 3, from the latches 101 to 10m, so that only X1 becomes effective. After that, each one of the addresses X2 to Xm becomes sequentially effective in response to Xinc indicating the effective period of the address Yn.

In this case, switches 151 to 15m are arranged in the memory select switching unit 50 in units of the addresses X1 to Xm. Usually, the switches 151 to 15m directly, selectively output the address 3 as the address 3' to the memory unit 20.

When the defect detection signal 6 is output and the address Y1 is selected at this time point, a signal EG becomes effective, and the addresses X2 to Xm, and X1 are selectively output as X1 to Xm of the address 3'.

Data shifted backward from the address 3 by one X address is output to the memory unit 20 as the address 3'.

Therefore, as shown in the timing chart of FIG. 11, when the defect detection signal 6 becomes effective at the addresses X1 and Y3, the addresses X1 and Y2 are output from the memory select switching unit 50 as the address 3'.

Data read out before the defective data by one data is read out from the memory unit 20 as the output data 4', in the same manner as in FIGS. 2B and 2D described above.

When the defect detection signal 6 becomes effective at the addresses X3 and Y1, since the Y address of the defective data is the start address (Y1), the X address is shifted backward by one, and the addresses X2 and Yn are output from the memory select switching unit 50 as the address 3'.

Hence, data read out before the defective data by one data is read out from the memory unit 20 as the output data 4'.

In this manner, the memory select switching unit 50 is arranged to control switching of the address 3' to the memory unit 20 in accordance with the defect detection signal 6, so that the memory cell that stores the correction data corresponding to this defective data is selected.

Therefore, a delay unit for generating the correction data becomes unnecessary. Even when the read out time positions of the readout data and that of the correction data for the readout data are away from each other, the correction data need not be delayed and held for a long period of time in the next stage of the memory unit 20, and degradation in the correction data can be avoided.

The fourth embodiment of the present invention will be described with reference to FIG. 12.

FIG. 12 shows a nonvolatile semiconductor memory according to the fourth embodiment of the present invention.

A description will be made on a nonvolatile semiconductor memory which converts an image signal stored in a memory unit 20, particularly a color interleave image signal formed of discrete analog luminance data output from an image sensing element such as a color CCD, into RGB image data, and outputs the RGB image data.

FIGS. 13A to 13D explain the relationship between a color interleave image signal and RGB image data, in which FIG. 13A shows the format of the color interleave image signal, FIG. 13B shows the format of the RGB image data, and FIGS. 13C and 13D show equations used for conversion.

The color interleave image signal of FIG. 13A has the luminance value of one primary color of R (red), G (green), and B (blue) in units of pixels constituting a sensed image. For example, at a pixel position D11 (=X1, Y1), the color interleave image signal only has blue luminance B11.

The RGB image data of FIG. 13B has the luminance values of RGB in units of pixels. For example, at a pixel position D11, the RGB image data has all of red luminance R11, green luminance G11, and blue luminance B11.

Accordingly, when generating the RGB image data from the color interleave image signal, the luminance value of a lacking color is obtained by using the luminance values of the pixels around the lacking color, as shown in FIGS. 13C and 13D.

For example, to obtain the red luminance R11 at the pixel position D11, the average of the red luminances of four adjacent pixels on the upper left, upper right, lower left, and lower right of the pixel position D11, i.e., R01, R10, R12, R21, is used.

Similarly, to obtain the green luminance G11, the average of the green luminances of four adjacent pixels above, below, on the left, and on the right of the pixel in question, i.e., G01, G10, G12, and G21, is used.

To obtain red luminance R12 at a pixel position D12 (=X1, Y2), the average of the red luminances of two adjacent pixels above and below the pixel position D12, i.e., R02 and R22, is used.

Similarly, to obtain blue luminance B12, the average of the blue luminances of adjacent pixels on the left and right of the pixel in question, i.e., B11 and B13, is used.

Accordingly, when the luminance values of surrounding pixels used for calculating the luminance are defective data, a correct pixel value cannot be calculated.

In this embodiment, as shown in FIG. 12, a defect position detection unit 30 checks whether defective data is included in the luminance values of surrounding pixels used for calculating the luminance because of, e.g., a defective memory cell in the memory unit 20.

When defective data is included, a data conversion unit 70 calculates a desired luminance value by using correct data other than the defective data, and outputs an RGB image signal 7.

This embodiment will be described in detail by way of a case wherein the luminance R11 at the pixel position D11 is to be calculated.

Figure 14:
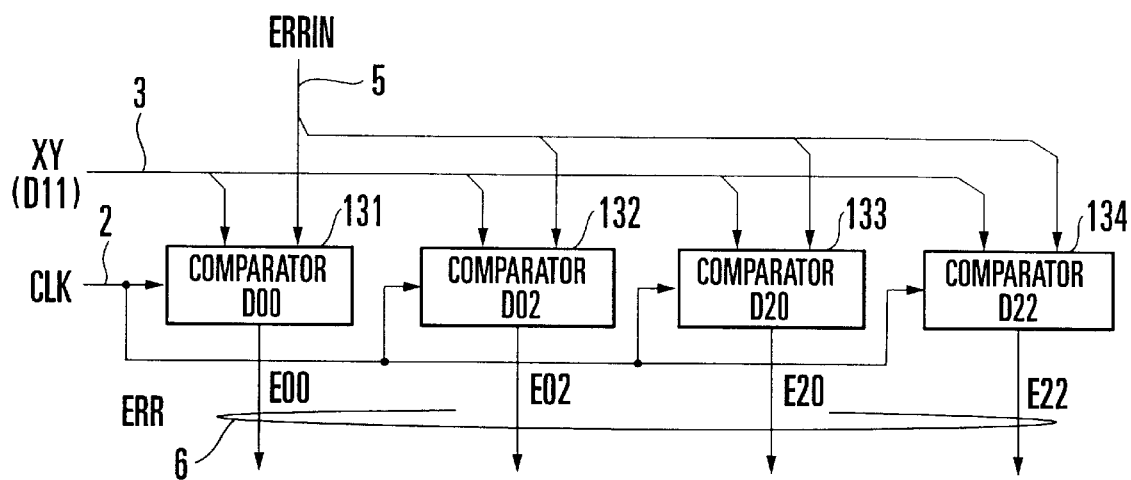
FIG. 14 is a circuit diagram showing another arrangement of the defect position detection unit.

FIG. 14 shows another arrangement of the defect position detection unit.

In FIG. 14, four comparators 131 to 134 are arranged. The comparators separately, respectively compare defect position information 5 with the positions of adjacent pixels on the upper left, upper right, lower left, and lower right of a pixel position indicated by an address 3 sent from a memory control unit 10.

For example, in the comparator 131, the address of an adjacent pixel position D00 on the upper left of D11 indicated by the address 3 is generated and compared with the defect position information 5. When coincidence is obtained, the comparator 131 outputs a defect detection signal E00 indicating that defective data is stored at D00.

Other comparators 132 to 134 similarly compare the respective addresses with the defect position information, and output defect detection signals E02, E20, and E22 when coincidence is obtained.

On the basis of the defect detection signal 6 (E00, E02, E20, and E22) generated in this manner in units of pixel positions, the data conversion unit 70 calculates a desired luminance value by using the remaining correct data from which defective data are removed.

Figure 15:
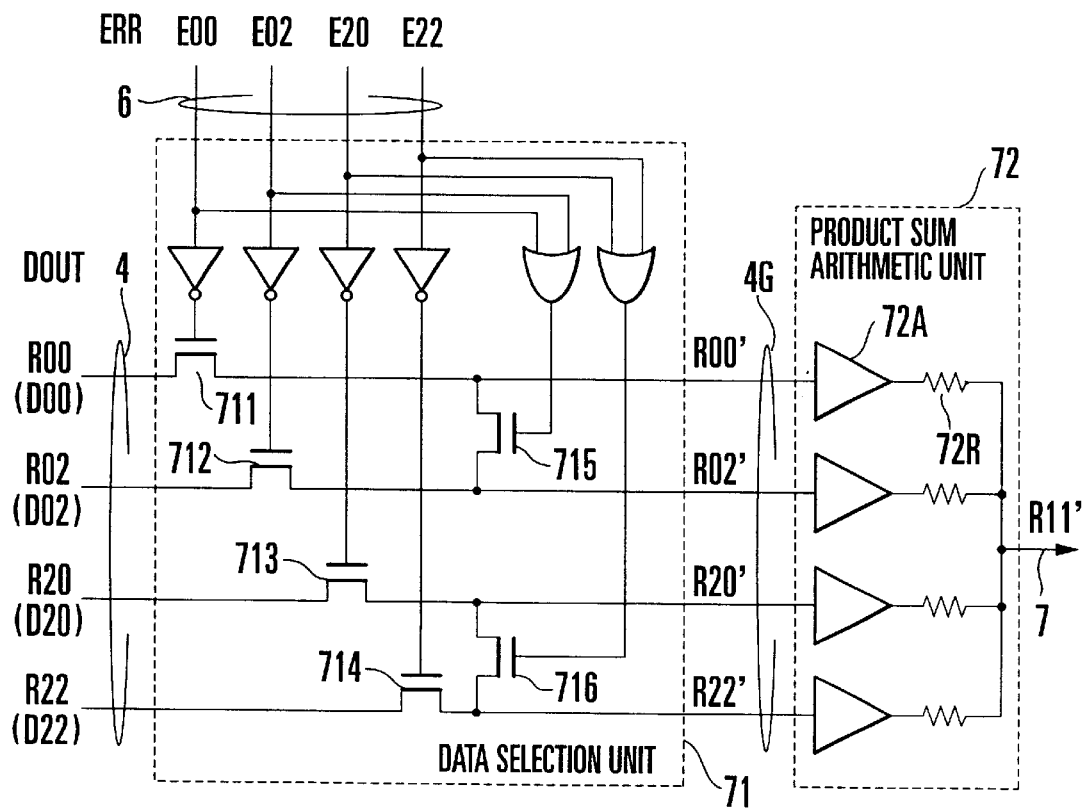
FIG. 15 is a circuit diagram showing an arrangement of a data conversion unit.

FIG. 15 shows an arrangement of the data conversion unit. In FIG. 15, defective data is replaced with either one of other correct data.

In a data selection unit 71 of FIG. 15, when either one of E00, E02, E20, and E22 of a defect detection signal 6 indicates the presence of defective data, a corresponding one of switches 711 to 714 is turned off to disable the input defective data.

Other data having the same Y address as that of the defect data are used by switches 715 and 716 in place of the defective data. Replaced data 4G (R00, R01, R20, and R22) in which the defective data is replaced with other correct data is output to a product sum arithmetic unit 72 at the next stage.

For example, when E00 indicates the presence of defective data, the switch 711 is turned off and the switch 715 is turned on, and R02 is output as R00'.

The product sum arithmetic unit 72 has the same arrangement as that of FIG. 7A described above. The product sum arithmetic unit 72 calculates the average of the replaced data 4G and outputs it as defect-corrected red luminance R11' at a pixel position D11.

In this manner, the defective data is replaced with the correct data used for calculating the luminance, so that a desired luminance value is calculated. Therefore, RGB image data not influenced by the defective data can be obtained with a comparatively simple circuit configuration.

Alternatively, the data conversion unit 70 may calculate a desired luminance value not by replacing the defective data with either specific data of other correct data, but by controlling the weight of the defective data.

Figure 16:
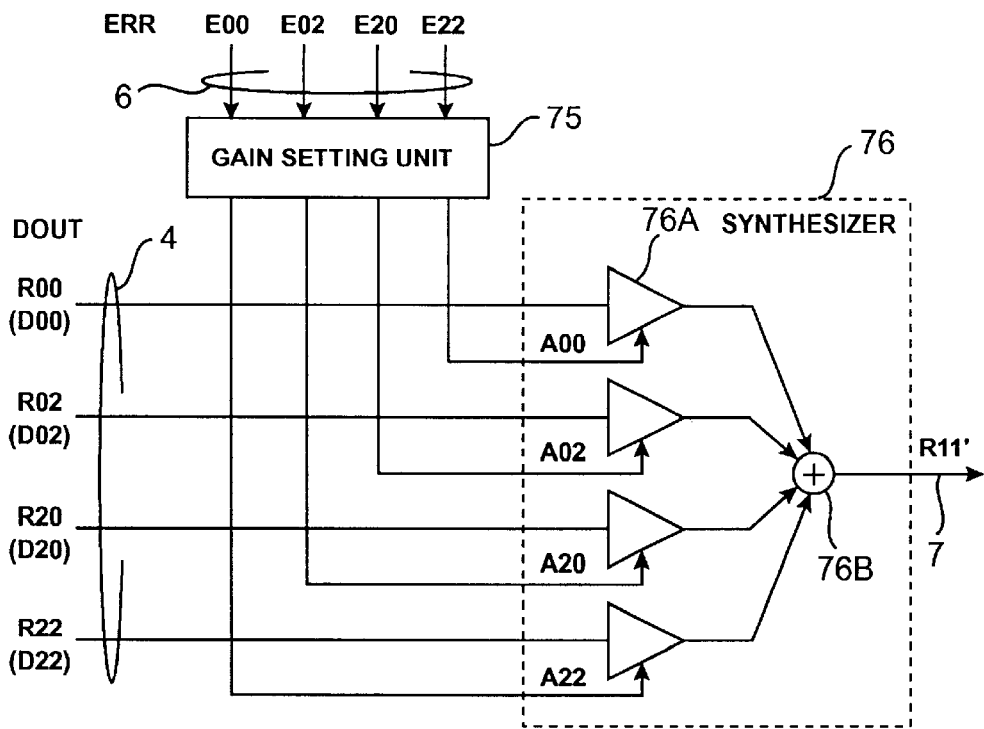
FIG. 16 is a view for explaining another arrangement of the data conversion unit.

FIG. 16 shows still another arrangement of the data conversion unit. In FIG. 16, the weight of the defective data is set to zero (or is decreased to a negligible degree).

Referring to FIG. 16, a synthesizer 76 has variable gain amplifiers 76A each capable of controlling its gain and respectively provided in units of data, data R00, R02, R20, and R22 in this case, used for calculating the luminance. Outputs from the amplifiers 76A are added by an adder 76B, and resultant defect-corrected red luminance R11' is output from the synthesizer 76.

Accordingly, the proportion of the respective data added by the adder 76B can be controlled by setting the gains, i.e., the weights, of the respective amplifiers 76A.

Gains A00, A02, A20, and A22 of the respective amplifiers 76A are set on the basis of a defect detection signal 6 (E00, E02, E20, and E22).

For example, when E00 indicates the presence of defective data, the weight of R00, i.e., the gain A00, is set to zero (or to a negligible degree).

The redundancy of R00 is shared by the gains A02, A20, and A22 of the other data R02, R20, and R22 so that the gain of the entire synthesizer 76 becomes 1.

As a result, the average of the other three correct data R02, R20, and R22 is output as R11'.

When compared to the arrangement of FIG. 15 described above, defect-corrected data having small deviations can be obtained not by replacing the defective data with specific data but by replacing it with the other correct data equally.

The data conversion unit 70 can use the switched capacitor scheme shown in FIG. 7C described above instead.

Figure 17:
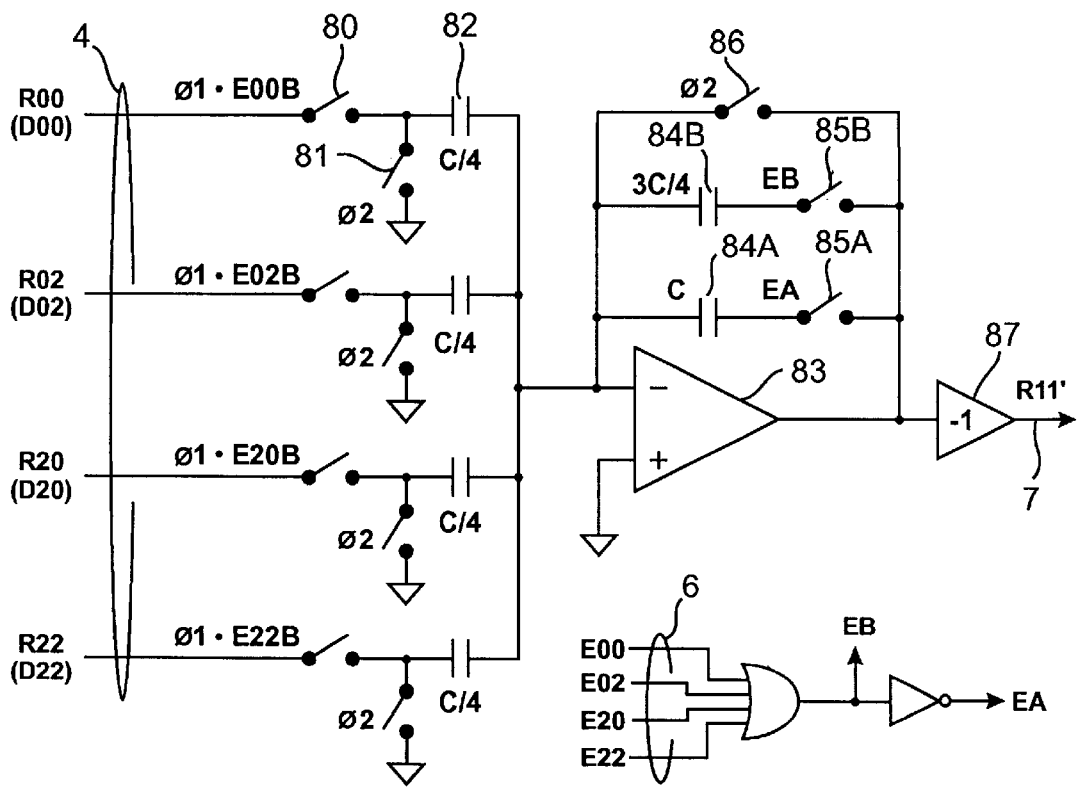
FIG. 17 is a circuit diagram showing still another arrangement of the data conversion unit.
Figure 18:
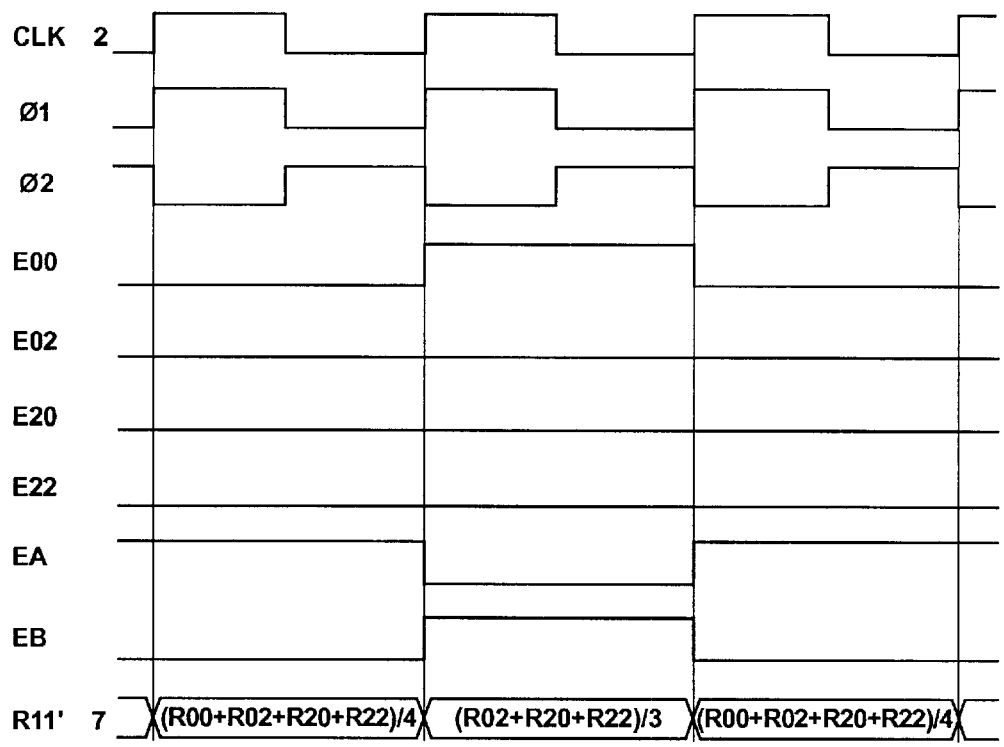
FIG. 18 is a timing chart showing the operation of FIG. 17.

FIG. 17 shows still another arrangement of the data conversion unit, and FIG. 18 shows its operation. This arrangement uses the switched capacitor scheme.

In FIG. 17, an inverting amplifier (operational amplifier) 83 having a capacitive element 84A with a predetermined capacitance C and a capacitive element 84B with a capacitance 3C/4 is arranged as a feedback circuit. Data R00, R02, R20, and R22 are input to the inverting input terminal of the inverting amplifier 83 through capacitive elements 82 each having a capacitance ¼ the capacitance C.

Both φ1 and φ2 are switching signals synchronized with a clock signal 2. φ1 is the inverted logic of φ2.

The input terminal of each capacitive element 82 is connected to switches 80 and 81. Each switch 80 enables/disables corresponding input data. Each switch 81 connects the input terminal of the corresponding capacitive element 82 to the middle point potential of the inverting amplifier 83. The capacitive elements 84A and 84B are discharged through a switch 86.

Each switch 80 is controlled by the logical product of φ1 and the inverted logic (E00B, E02B, E20B, and E22B; B indicates a bar) of a defect detection signal 6 corresponding to the respective data. Only data of which a defect is detected keeps the corresponding switch 80 off to disable the input defective data.

Switches 85A and 85B are respectively connected in series with the capacitive elements 84A and 84B, and are turned on/off by control signals EA and EB, respectively.

The control signal EB is the logical sum output of the defect detection signals E00, E02, E20, and E22, and becomes effective when a defect is present in either one of data used for calculating the luminance. The control signal EA is the inverted logic output of the control signal EB, and becomes effective only when all data are correct.

The operation of FIG. 17 will be described with reference to FIG. 18.

For example, when all data R00, R02, R20, and R22 are correct, all the switches 80 are ON during the effective period of φ1, and charges corresponding to the voltages (luminance values) of the respective data are stored in the corresponding capacitive elements 82.

Simultaneously, the control signal EA becomes effective to turn on the switch 85A, so the charges in the capacitive elements 82 move to the capacitive element 84A.

Since the capacitance C of the capacitive element 84A is four times the capacitance C/4 of each capacitive element 82, the voltage across the capacitive element 84A exhibits the average of the four data, and this voltage is output from the inverting amplifier 83 as a desired luminance value.

The switches 80 are turned off by φ1 and the switches 81 and 86 are turned on by φ2 to discharge the capacitive elements 82 and 84A, so that the capacitive elements 82 and 84A are initialized for the next data.

When the defect detection signal E00 indicates the presence of defective data, only the switches 80 for R02, R20, and R22 are ON during the effective period of φ1, and charges corresponding to the voltage values (luminance values) of these three data are stored in the corresponding capacitive elements 82.

Simultaneously, the control signal EB becomes effective to turn on the switch 85B, so the charges in the capacitive elements 82 move to the capacitive element 84B.

Since the capacitance 3C/4 of the capacitive element 84B is three times the capacitance C/4 of each capacitive element 82, the voltage across the capacitive 84B exhibits the average of the three correct data, and this voltage is output from the inverting amplifier 83 as a defect-corrected luminance value.

Since the output from the inverting amplifier 83 represents the inverted average of the respective data, a desired luminance value, red luminance R11' in this case, can be obtained by using an inverting buffer (gain=-1) 87 or the like.

When this switched capacitor scheme is used, the number of amplifiers as analog circuits can be reduced, and the area occupied by the analog circuits on the memory chip can be reduced.

The fifth embodiment of the present invention will be described with reference to FIG. 19.

Figure 19:
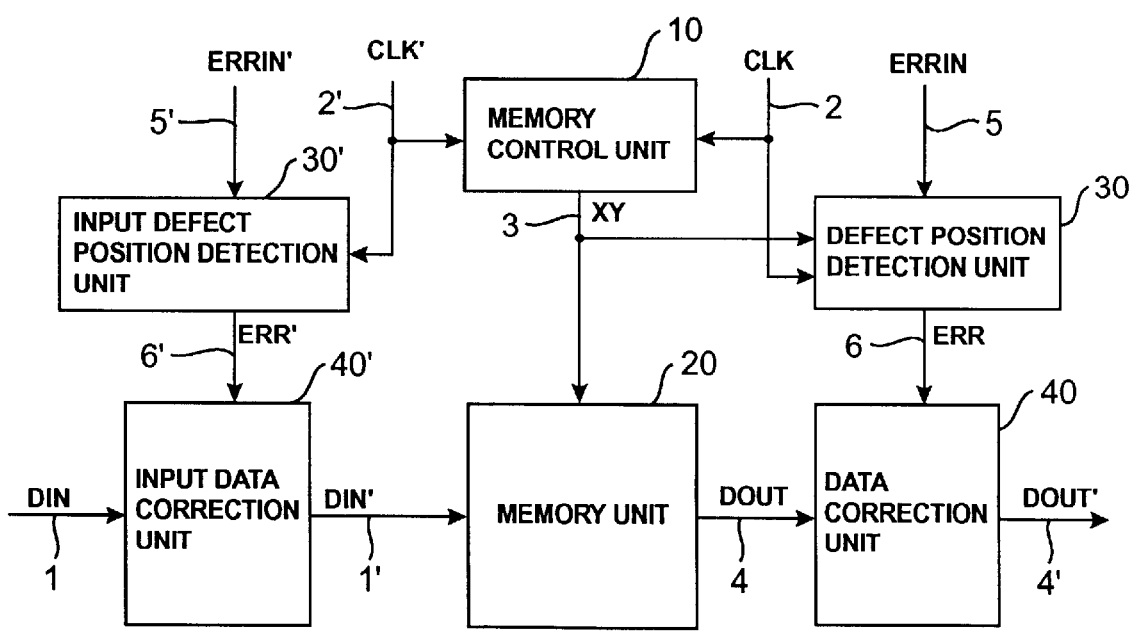
FIG. 19 is a block diagram showing a nonvolatile semiconductor memory according to the fifth embodiment.
Figure 20:
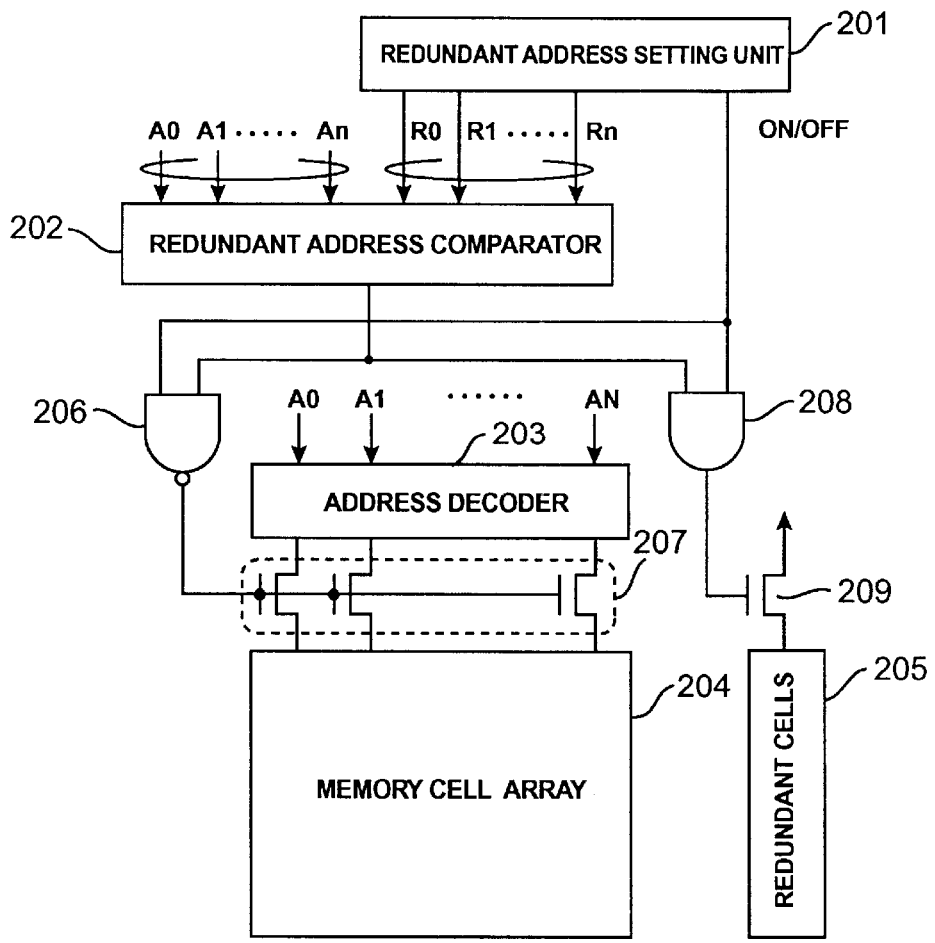
FIG. 20 is a block diagram showing a redundant arrangement of a conventional semiconductor memory.
Figure 21A:
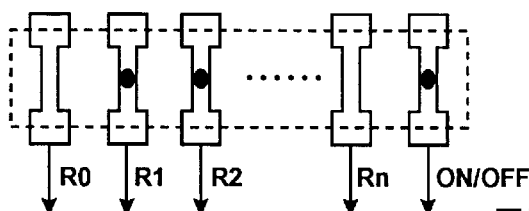
FIGS. 21A and 21B are views for explaining arrangements of a redundant address setting unit.
Figure 21B:
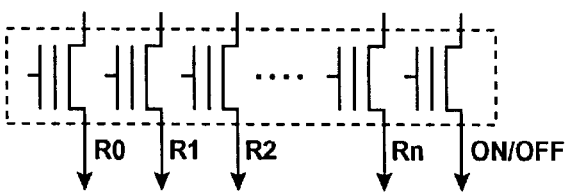

FIG. 19 shows a nonvolatile semiconductor memory according to the fifth embodiment of the present invention.

In the fifth embodiment, when compared to the nonvolatile semiconductor memory (see FIG. 1) according to the first embodiment, an input data correction unit 40' is connected to the input of a memory unit 20, and an analog signal 1' obtained by correcting defective data on an input analog signal 1 is stored in the memory unit 20.

Assume that a memory control unit 10 is used for both read out/write operation. In analog signal write, the memory control unit 10 generates a write address 3 on the basis of a write clock signal (CLK') 2' different from a read out clock signal (CLK) 2.

An input defect position detection unit 30' is separately provided for the input data correction unit 40'. The input data correction unit 40' detects defective data on the analog signal (DIN) 1 on the basis of input defect position information 5' indicating the position of the defective data on the analog signal 1 to be written in the memory unit 20.

On the basis of a defect detection signal (ERR') 6' from the input defect position detection unit 30', the input data correction unit 40' corrects the defective data.

Particularly, in a signal such as an image signal which is repeated periodically, a defect sometimes occurs at a specific time position in the period due to the defect of an image sensing element or the like. In this case, the input defect position information 5' indicating the time position of this defective data may be used.

As the arrangement of the input data correction unit 40', for example, those in FIGS. 2A and 2C, and FIG. 4A can be used by considering a degradation in signal over time.

In this manner, the defective data on the input analog signal 1 is corrected at the input stage of the memory unit 20, and after that, the defect-corrected data is stored in the memory unit 20. Therefore, data correction can be performed at the stage next to the memory unit 20 by using data having a lower defect rate, so that the defective data in the memory cell can be corrected at higher precision.

In FIG. 19, in contrast to the first embodiment, an arrangement in which the defective data on the input analog signal 1 is corrected is employed. However, the present invention is not limited to this, but can be applied to any nonvolatile semiconductor memories proposed in the present invention, to obtain the same function and effect as those described above.

In the first to fourth embodiments described above, the readout data 4 output from the memory unit 20 is corrected on the basis of the defect position information 5 indicating the position of a defective memory cell in the memory unit 20, and is output. As the defect position information, input defect position information indicating the position of the defective data on the analog signal (DIN) 1 to be written in the memory unit 20 may be used.

Then, even when the defective data included in the input analog signal 1 is stored in the memory unit 20, it can be output after it is corrected during a read out.

Both the input defect position information indicating the defect of the input analog signal 1 and the information indicating a defect in the memory cell in the memory unit 20 may be used as the defect position information 5. Then, data in which both the defective data included in the analog signal 1 and the defect of the memory unit 20 are corrected can be output.

As has been described above, according to the present invention, the defect position detection unit is arranged to detect, on the basis of defect position information indicating the position of defective analog data included in the analog data read out from the memory unit, that a memory cell corresponding to the defect position is selected by a memory control unit, and to output a detection output. In accordance with the detection output from this defect position detection unit, the analog data at the defect position is corrected by using analog data read out from at least another memory cell corresponding to this defect position.

When compared to the conventional case wherein the redundant cell and the control circuit portion for it are formed on the chip in advance, such a redundant arrangement becomes unnecessary, and the chip area can be utilized effectively.

In particular, in an analog nonvolatile semiconductor memory which stores an analog signal in the form of an analog value, as the resolving power of the image signal increases, an increase in memory capacity is sought for. Hence, a more obvious effect can be obtained.

What is claimed is:

1. A nonvolatile semiconductor memory comprising:
   a memory unit having a plurality of memory cells to discretely store an analog signal, such as an image signal, as analog data in the form of an analog value;
   a memory control unit for sequentially selecting said memory cells as a read out target of said memory unit in response to a predetermined clock;
   a defect position detection unit for detecting, on the basis of defect position information indicating a position of defective analog data included in the analog data read out from said memory unit, whether a memory cell corresponding to the defect position is selected by said memory control unit, and outputting a detection output; and
   a data correction unit for correcting the analog data at the defect position in accordance with the detection output from said defect position detection unit by using another analog data of the analog signal stored in said memory unit.

2. A memory according to claim 1, wherein said data correction unit comprises:
   a delay unit for delaying the analog data output from said memory unit by at least one data period and outputting the delayed analog data; and
   a signal switching unit for directly outputting the analog data output from said memory unit if said detection output indicates that a memory cell corresponding to the defect position is not selected by said memory control unit, and switchingly outputting a first delayed analog data output from said delay unit in place of defective analog data corresponding to the defect position if said detection output indicates that a memory cell corresponding to the defect position is selected by said memory control unit, said first delayed analog data corresponding to analog data read out from said memory unit prior to the defective analog data.

3. A memory according to claim 1, wherein said data correction unit comprises:
- a delay unit for delaying the analog data read out from said memory unit by at least one data period and outputting the delayed analog data; and
- a signal switching unit for outputting the analog data delayed by and output from said delay unit if said detection output indicates that a memory cell corresponding to the defect position is not selected by said memory control unit, and switchingly outputting directly a first analog data if said detection output indicates that a memory cell corresponding to the defect position is selected by said memory control unit, said first analog data corresponding to analog data read out from said memory unit after the defective analog data.

4. A memory according to claim 1, wherein said data correction unit comprises:
- a first delay unit for delaying the analog data read out from said memory unit by at least one data period and outputting the delayed analog data;
- a second delay unit for delaying the analog data read out from said memory unit by a period longer than a delay period of said first delay unit and outputting the delayed analog data;
- an interpolating arithmetic unit for performing an arithmetic operation of the analog data read out from said memory unit and the analog data delayed by and output from said second delay unit, to output interpolated analog data of the analog data delayed by and output from said first delay unit; and
- a signal switching unit for outputting the analog data delayed by and output from said first delay unit if said detection output indicates that a memory cell corresponding to the defect position is not selected by said memory control unit, and switchingly outputting the interpolated analog data output from said interpolating arithmetic unit in place of analog data corresponding to the defect position if said detection output indicates that a memory cell corresponding to the defect position is selected by said memory control unit.

5. A memory according to claim 1, wherein:
said memory unit comprises means for, when an arbitrary memory cell is selected by said memory control unit, outputting analog data read out from said selected memory cell as selected analog data, and separately outputting analog data read out from another memory cell corresponding to the selected memory cell as correction analog data; and
said data correction unit comprises a signal switching unit for outputting the selected analog data read out from said memory unit if said detection output indicates that a memory cell corresponding to the defect position is not selected by said memory control unit, and switchingly outputting the correction analog data output from said memory unit in place of the selected analog data corresponding to the defect position if said detection output indicates that a memory cell corresponding to the defect position is selected by said memory control unit.

6. A memory according to claim 1, wherein:
said memory unit comprises means for, when an arbitrary memory cell is selected by said memory control unit, outputting analog data read out from said selected memory cell as selected analog data, and separately outputting analog data read out from a plurality of other memory cells corresponding to the selected memory cell as correction analog data; and
said data correction unit comprises:
- an interpolating arithmetic unit for performing a product sum arithmetic operation of the correction analog data read out from said memory unit, to output interpolated analog data of said selected memory cell; and
- a signal switching unit for outputting the selected analog data read out from said memory unit if said detection output indicates that a memory cell corresponding to the defect position is not selected by said memory control unit, and switchingly outputting the interpolated analog data output from said interpolating arithmetic unit in place of the selected analog data corresponding to the defect position if said detection output indicates that a memory cell corresponding to the defect position is selected by said memory control unit.

7. A memory according to claim 1, wherein said data correction unit includes a signal switching unit for switchingly outputting a first analog data in place of the analog data corresponding to the defect position when the detection output indicates that a memory cell corresponding to the defect position is selected by said memory control unit, said first analog data being read out from said memory unit prior to the analog data corresponding to the defect position.

8. A memory according to claim 1, wherein said data correction unit includes a signal switching unit for switchingly outputting a first analog data in place of the analog data corresponding to the defect position when the detection output indicates that a memory cell corresponding to the defect position is selected by said memory control unit, said first analog data being read out from said memory unit after the analog data corresponding to the defect position.

9. A memory according to claim 1, wherein said data correction unit includes a signal switching unit for switchingly outputting an interpolated analog data in place of the analog data corresponding to the defect position when the detection output indicates that a memory cell corresponding to the defect position is selected by said memory control unit, said interpolated analog data being obtained from a first analog data and a second analog data, said first analog data being read out from said memory unit prior to the analog data corresponding to the defect position, and said second analog data being read out from said memory unit after the analog data corresponding to the defect position.

10. A nonvolatile semiconductor memory comprising:
- a memory unit having a plurality of memory cells to discretely store an analog signal such as an image signal, as analog data in the form of an analog value;
- a memory control unit for sequentially selecting said memory cells as a read out target of said memory unit in response to a predetermined clock;
- a defect position detection unit for detecting, on the basis of defect position information indicating a position of defective analog data included in the analog data read out from said memory unit, whether a memory cell corresponding to the defect position is selected by said memory control unit, and outputting a detection output; and a memory select switching unit arranged between said memory control unit and said memory unit to switchingly select another memory cell in place of said memory cell corresponding to the defect position if said detection output indicates that the memory cell corresponding to the defect position is selected by said memory control unit, said another memory cell storing analog data of said analog signal.

11. A nonvolatile semiconductor memory for storing an image signal indicating a color image obtained by an image sensing element such as a color CCD and having luminance values of primary colors that are different according to pixel positions of the color image, the luminance values being sequentially arranged on a time axis in the form of analog values, comprising:

a memory unit having a plurality of memory cells to discretely store the luminance values at the respective pixel positions stored on the image signal as analog luminance data in the form of an analog value;

a memory control unit for sequentially selecting said memory cells as a read out target of said memory unit in response to a predetermined clock;

a data conversion unit for performing an arithmetic process of a plurality of other analog luminance data at pixel positions that are adjacent on the color image to each of selected pixel positions corresponding to selected analog luminance data stored in said selected memory cells, to calculate the analog luminance data of the primary colors at the selected pixel positions, and for outputting the calculated data as color image data; and a defect position detection unit for detecting, on the basis of defect position information indicating a position of defective data included in the analog luminance data read out from said memory unit, whether the analog luminance data used by said data conversion unit includes defective data, and outputting a detection output, wherein said memory unit comprises means for, when an arbitrary memory cell is selected by said memory control unit, outputting analog luminance data stored in said selected memory cell as selected analog luminance data, and reading out a plurality of other analog luminance data at pixel positions that are adjacent on a color image to selected pixel positions corresponding to the selected analog luminance data, and outputting the readout data from said memory cells, and said data conversion unit has:

a data selection unit for outputting a plurality of the analog luminance data used for an arithmetic process if the detection output indicates that the analog luminance data used for the arithmetic process does not include defective data, and switchingly outputting in place of the defective data another one of the analog luminance data used for the arithmetic process if the detection output indicates that the analog luminance data used for the arithmetic process includes defective data; and an arithmetic processing unit for performing an arithmetic process of the analog luminance data output from said data selection unit to calculate analog luminance data of the primary colors.

12. A nonvolatile semiconductor memory for storing an image signal indicating a color image obtained by an image sensing element such as a color CCD and having luminance values of primary colors that are different according to pixel positions of the color image, the luminance values being sequentially arranged on a time axis in the form of analog values, comprising:

a memory unit having a plurality of memory cells to discretely store the luminance values at the respective pixel positions stored on the image signal as analog luminance data in the form of an analog value;

a memory control unit for sequentially selecting said memory cells as a read out target of said memory unit in response to a predetermined clock;

a data conversion unit for performing an arithmetic process of a plurality of other analog luminance data at pixel positions that are adjacent on the color image to each of selected pixel positions corresponding to selected analog luminance data stored in said selected memory cells, to calculate the analog luminance data of the primary colors at the selected pixel positions, and for outputting the calculated data as color image data; and a defect position detection unit for detecting, on the basis of defect position information indicating a position of defective data included in the analog luminance data read out from said memory unit, whether the analog luminance data used by said data conversion unit includes defective data, and outputting a detection output, wherein said memory unit comprises means for, when an arbitrary memory cell is selected by said memory control unit, outputting analog luminance data stored in said selected memory cell as selected analog luminance data, and reading out a plurality of other analog luminance data at pixel positions that are adjacent on the color image to selected pixel positions corresponding to the selected analog luminance data, and outputting the readout data from said memory cells, and said data conversion unit has:

a synthesizer for amplifying the plurality of analog luminance data used for the arithmetic process and thereafter synthesizing the amplified analog luminance data; and a gain setting unit for setting a gain value corresponding to each of the plurality of analog luminance data used for the arithmetic process to be equal if the detection output indicates that the analog luminance data used for the arithmetic process does not include defective data, and decreasing a gain value corresponding to defective data and uniformly increasing gain values corresponding to other correct analog luminance data if the detection output indicates that the analog luminance data used for the arithmetic process includes defective data.

13. A memory according to claim 1, further comprising:

an input defect position detection unit for detecting defective data on the analog signal on the basis of input defect position information indicating a position of the defective data included in the analog signal input to said memory unit; and an input data correction unit for correcting the analog data at the defect position by using other analog data on the analog signal.

14. A memory according to claim 10, further comprising:

an input defect position detection unit for detecting defective data on the analog signal on the basis of input defect position information indicating a position of the defective data included in the analog signal input to said memory unit; and an input data correction unit for correcting the analog data at the defect position by using other analog data on the analog signal.

15. A memory according to claim 11, further comprising:

an input defect position detection unit for detecting defective data on the image signal on the basis of input defect position information indicating a position of the defective data included in the image signal input to said memory unit; and an input data correction unit for correcting the analog luminance data at the defect position by using other analog luminance data on the image signal.

16. A memory according to claim 12, further comprising:

an input defect position detection unit for detecting defective data on the image signal on the basis of input defect position information indicating a position of the defective data included in the image signal input to said memory unit; and an input data correction unit for correcting the analog luminance data at the defect position by using other analog luminance data on the image signal.

17. A memory according to claim 1, wherein said defect position detection unit uses, as the defect position information, information indicating a position of the defective data included in the analog signal input to said memory unit.

18. A memory according to claim 10, wherein said defect position detection unit uses, as the defect position information, information indicating a position of the defective data included in the analog signal input to said memory unit.

19. A memory according to claim 11, wherein said defect position detection unit uses, as the defect position information, information indicating a position of the defective data included in the image signal input to said memory unit.

20. A memory according to claim 12, wherein said defect position detection unit uses, as the defect position information, information indicating a position of the defective data included in the image signal input to said memory unit.

21. A memory according to claim 1, wherein said defect position detection unit uses, as the defect position information, both information indicating a position of a defective memory cell present in said memory unit, and information indicating a position of defective data included in the analog signal input to said memory unit.

22. A memory according to claim 10, wherein said defect position detection unit uses, as the defect position information, both information indicating a position of a defective memory cell present in said memory unit, and information indicating a position of defective data included in the analog signal input to said memory unit.

23. A memory according to claim 11, wherein said defect position detection unit uses, as the defect position information, both information indicating a position of a defective memory cell present in said memory unit, and information indicating a position of defective data included in the image signal input to said memory unit.

24. A memory according to claim 12, wherein said defect position detection unit uses, as the defect position information, both information indicating a position of a defective memory cell present in said memory unit, and information indicating a position of defective data included in the image signal input to said memory unit.

* * * * *